(12) United States Patent
Sekar et al.

(10) Patent No.: US 8,435,831 B2
(45) Date of Patent: May 7, 2013

(54) NON-VOLATILE STORAGE WITH METAL OXIDE SWITCHING ELEMENT AND METHODS FOR FABRICATING THE SAME

(75) Inventors: Deepak C. Sekar, San Jose, CA (US); Franz Kreupl, Mountain View, CA (US); Raghuveer Makala, Milpitas, CA (US); Peter Rabkin, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/942,575

(22) Filed: Nov. 9, 2010

(65) Prior Publication Data

US 2011/0227026 A1 Sep. 22, 2011

Related U.S. Application Data

(60) Provisional application No. 61/314,564, filed on Mar. 16, 2010.

(51) Int. Cl.
 *H01L 21/00* (2006.01)
(52) U.S. Cl.
 USPC .................................. 438/104; 257/4; 257/43
(58) Field of Classification Search .................. 438/104; 257/2, 4, 43
 See application file for complete search history.

(56) References Cited

U.S. PATENT DOCUMENTS

| | | | |
|---|---|---|---|
| 6,872,963 B2* | 3/2005 | Kostylev et al. ................ 257/2 |
| 7,491,574 B2* | 2/2009 | Dennison ..................... 438/102 |
| 7,741,669 B2* | 6/2010 | Baek et al. ..................... 257/296 |
| 7,750,336 B2 | 7/2010 | Lee et al. |
| 7,933,139 B2* | 4/2011 | Lung .............................. 365/148 |
| 2004/0159828 A1* | 8/2004 | Rinerson et al. .................. 257/2 |
| 2008/0246014 A1* | 10/2008 | Lung .................................. 257/4 |
| 2009/0111212 A1* | 4/2009 | Lowrey et al. ................ 438/102 |
| 2009/0272959 A1* | 11/2009 | Phatak et al. ...................... 257/2 |
| 2009/0308636 A1 | 12/2009 | Chudzik et al. |
| 2010/0038791 A1* | 2/2010 | Lee et al. ........................ 257/758 |
| 2010/0176365 A1* | 7/2010 | Park et al. ........................... 257/3 |

OTHER PUBLICATIONS

Yang et al., "Electrical and Reliability Characteristics of 1nm Ultrathin Oxynitride Gate Dielectric Prepared by RTP", IEEE Conference on Electron Devices and Solid-State Circuits, Dec. 2003.

(Continued)

*Primary Examiner* — Fernando L Toledo
*Assistant Examiner* — Bryan Junge
(74) *Attorney, Agent, or Firm* — Vierra Magen Marcus LLP

(57) ABSTRACT

Non-volatile storage elements having a reversible resistivity-switching element and techniques for fabricating the same are disclosed herein. The reversible resistivity-switching element may be formed by depositing an oxygen diffusion resistant material (e.g., heavily doped Si, W, WN) over the top electrode. A trap passivation material (e.g., fluorine, nitrogen, hydrogen, deuterium) may be incorporated into one or more of the bottom electrode, a metal oxide region, or the top electrode of the reversible resistivity-switching element. One embodiment includes a reversible resistivity-switching element having a bi-layer capping layer between the metal oxide and the top electrode. Fabricating the device may include depositing (un-reacted) titanium and depositing titanium oxide in situ without air break. One embodiment includes incorporating titanium into the metal oxide of the reversible resistivity-switching element. The titanium might be implanted into the metal oxide while depositing the metal oxide, or after deposition of the metal oxide.

11 Claims, 16 Drawing Sheets

OTHER PUBLICATIONS

Wu et al, "Carrier Transportation Mechanism of the TaN/Hf02/IL/Si Structure With Silicon Surface Fluorine Implantation", IEEE Transactions on Electron Devices, vol. 55, No. 7, Jul. 2008.

Ragnarsson et al., "Ultra Low-EOT (5 Å) Gate-First and Gate-Last High Performance CMOS Achieved by Gate-Electrode Optimization", IEEE International Electron Devices Meeting (IEDM), Dec. 2009.

Sadeghipour et al., "Phase Change Random Access Memory, Thermal Analysis", The Tenth Intersociety Conference on Thermal and Thermomechanical Phenomena in Electronics Systems, May-Jun. 2006.

* cited by examiner

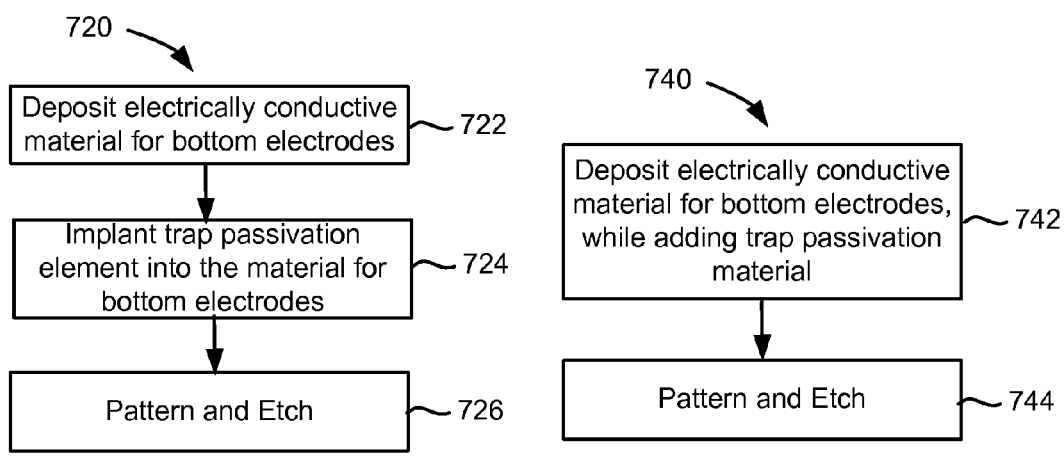

NON-VOLATILE STORAGE WITH METAL OXIDE SWITCHING ELEMENT AND METHODS FOR FABRICATING THE SAME

PRIORITY CLAIM

The present application claims priority to U.S. Provisional Patent Application Ser. No. 61/314,564, filed Mar. 16, 2010 entitled, "NON-VOLATILE STORAGE WITH METAL OXIDE SWITCHING ELEMENT."

BACKGROUND

1. Field

The present disclosure relates to non-volatile storage devices.

2. Description of the Related Art

Materials having a detectable level of change in state, such as a resistance, are used to form various types of non-volatile semiconductor based memory cells. It has been proposed that such memory cells might be used for binary data storage in memory arrays by assigning a lower resistance state of a memory cells to a first logical state such as logical '0,' and assigning a higher resistance state of the memory cell to a second logical state such as logical '1.' Other logical data assignments to resistance states may also be used. Some materials can be reset back to a higher resistance state after being set from an initial state to a lower resistance state. These types of materials can be used to form re-writable memory cells. Multiple levels of detectable resistance in materials might be used to form multi-state memory cells which may or may not be re-writable.

One type of memory cell that exhibits switching behavior between at least two resistance states is referred to as ReRAM for "resistive switching RAM". ReRAM may also be referred to as R-RAM or RRAM. A ReRAM memory cell may include a first electrode, a re-writable switching material (also referred to as a state change element), and a second electrode. The switching material may be metal oxide ($MeO_x$). Switching the memory cell between resistance states may be achieved by applying a voltage across the memory cell. An alternative way of explaining the switching between resistance states is to provide a current to the memory cell.

One theory that is used to explain the switching mechanism is that one or more conductive filaments are formed by the application of a voltage (or other signal) to the memory cell. For some memory cells, the conductive path may arise due to oxygen vacancies that are caused by application of the voltage. This path (or paths) may link the first and second electrodes, wherein the conductive filament(s) lowers the resistance of the memory cell. Application of another voltage may rupture the conductive filament(s), thereby increasing the resistance of the memory cell. Application of another still another voltage may repair the rupture in the conductive filament(s), thereby decreasing the resistance of the memory cell once again.

The reversible resistivity-switching element may be in the high resistance state when it is first fabricated. The term "forming" is sometimes used to describe putting the reversible resistivity-switching element into a lower resistance state for the first time. Thus, the initial formation of the conductive filaments is sometimes referred to as "forming." The rupture of the filaments is sometimes referred to as RESETTING. The repair of the rupture of the filaments is sometimes referred to as SETTING.

For various reasons, it may be desirable to reduce the voltage that is needed to switch the memory cell from one state to the other. It may also be desirable to reduce the power needed to switch the memory cell state. It may also be desirable to reduce the current needed to switch the memory cell state. For example, reducing the current that is needed to reset the memory cell may be beneficial in that it may reduce disturb issues and reduce stress on the memory cell. Reducing stress may increase the number of set/reset cycles that are possible. Reducing the required reset current can also reduce power requirements.

BRIEF DESCRIPTION OF THE DRAWINGS

FIG. 7B is a flowchart illustrating one embodiment of a process of implanting a trap passivation material after deposition of a bottom electrode.

FIG. 7C is a flowchart illustrating one embodiment of a process of incorporating a trap passivation material in a bottom electrode in situ.

DETAILED DESCRIPTION

Figure 1:
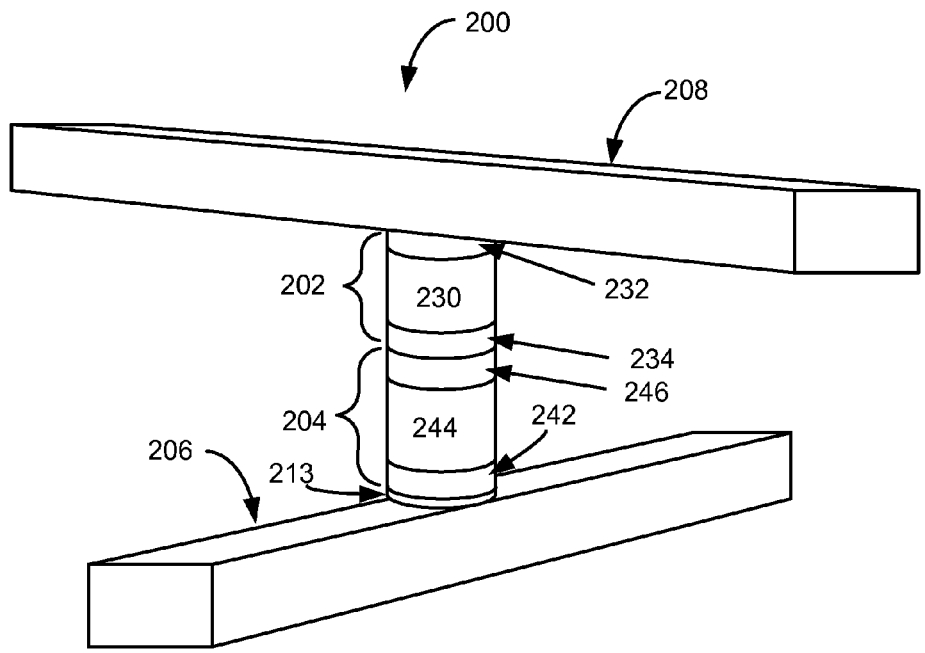
FIG. 1 depicts an example structure for a non-volatile memory cell that can be used in accordance with embodiments of the present disclosure.

Non-volatile storage elements and techniques for fabricating non-volatile storage elements are disclosed herein. The non-volatile storage element may have a reversible resistivity-switching element. As one example, the reversible resistivity-switching element may include a metal oxide region and a top and bottom electrode. The reversible resistivity-switching element may have other regions, as well. In some embodiments, the reversible resistivity-switching element is placed in series with a steering element such as a diode to form a memory cell.

In one embodiment, the reversible resistivity-switching element is fabricated by depositing an oxygen diffusion resistant material over the top electrode. As one example, heavily doped silicon is deposited in situ over the top electrode. This may prevent formation of oxide on the top electrode. Preventing formation of oxide in the top electrode may prevent oxygen from migrating to the bottom electrode, where it might oxidize the bottom electrode. Other oxygen diffusion resistant materials such as tungsten or tungsten nitride could also be deposited over the top electrode.

In one embodiment, a trap passivation material is incorporated into one or more of the bottom electrode, a metal oxide region, or the top electrode of the reversible resistivity-switching element. Examples of the trap passivation material include, but are not limited to, fluorine, nitrogen, hydrogen, and deuterium. In some embodiments, the trap passivation material passivates dangling bonds. This may lead to fewer traps at the interface between the bottom electrode and the metal oxide and/or the top electrode and the metal oxide. Reducing the traps may result in a higher effective work function for the top electrode, which may improve memory cell performance.

One embodiment includes a reversible resistivity-switching element having a bi-layer capping layer between the metal oxide and the top electrode. Fabricating the bi-layer capping layer may include depositing (un-reacted) titanium and depositing titanium oxide in situ without air break.

One embodiment includes incorporating titanium into the metal oxide of the reversible resistivity-switching element. The titanium might be implanted into the metal oxide while depositing the metal oxide, or after deposition of the metal oxide. In one embodiment, sub-plantation is used to create a titanium region between two metal oxide regions in the reversible resistivity-switching element.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, intervening elements or layers may be present. In contrast, when an element or layer is referred to as being "directly formed on," to another element, there are no intervening elements or layers present. Other words used to describe the relationship between elements or layers should be interpreted in a like fashion (e.g., "in contact with" versus "in direct contact with," "between," versus "directly between," "adjacent," versus "directly adjacent," etc.).

Example Non-Volatile Storage Elements and Arrays

FIG. 1 is a simplified perspective view of one embodiment of a memory cell 200 which includes a reversible resistivity-switching element 202 coupled in series with a steering element 204 between a first conductor 206 and a second conductor 208. Various embodiments of reversible resistivity-switching element 202 disclosed herein may be used for the reversible resistivity-switching element 202 in FIG. 1.

Reversible resistivity-switching element 202 includes reversible resistivity-switching material 230 having a resistance that may be reversibly switched between two or more states. In some embodiments, the reversible resistivity-switching material 230 is formed from metal oxide (MeO$_x$). Various different metal oxides can be used. The reversible resistivity-switching material may be in an initial high-resistance state upon fabrication that is switchable to a low-resistance state upon application of a first physical signal. For example, the device may switch states in response to application of a first amount of energy, charge, heat, voltage, current or other physical phenomena. Application of a second amount of energy, charge, heat, voltage, current or other physical phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other physical phenomena. When used in a memory cell, one resistance state may represent a binary "0" while another resistance state may represent a binary "1." However, more than two data/resistance states could possibly be used.

In one embodiment, the process of switching the resistance from the high-resistance state to the low-resistance state is referred to as SETTING the reversible resistivity-switching element 202. The process of switching the resistance from the low-resistance state to the high-resistance state is referred to as RESETTING the reversible resistivity-switching element 202. The high-resistance state may be associated with binary data "0" and the low-resistance state is associated with binary data "1." In other embodiments, SETTING and RESETTING and/or the data encoding can be reversed.

Reversible resistivity-switching element 202 may include electrodes 232 and 234. Electrode 232 is positioned between reversible resistivity-switching material 230 and conductor 208. In one embodiment, electrode 232 includes TiN. In one embodiment, electrode 232 is a bi-layer electrode. The bi-layer electrode may have a metal layer (e.g. TiN) and a layer of oxygen diffusion resistant material (e.g., heavily doped Si, W, or WN). Electrode 234 is positioned between reversible resistivity-switching material 230 and diode 204. In one embodiment, electrode 234 is made of heavily doped silicon. However, electrode 234 could be formed from another material.

In some embodiments, the memory cell 200 includes a capping layer between the reversible resistivity-switching material 230 and electrode 232. In one embodiment, the capping layer includes titanium. In one embodiment, the capping layer is a bi-layer. For example, one layer is titanium and another is titanium oxide.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 1, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the steering element 204 in FIG. 1, it will be understood that in alternative embodiments, the reversible resistivity-switching element 202 may be positioned below the steering element 204. For example, the reversible resistivity-switching element 202 might be near conductor 206, whereas steering element 204 is near conductor 208. Also note that the entire structure of FIG. 1 could be turned upside down.

Figure 2A:
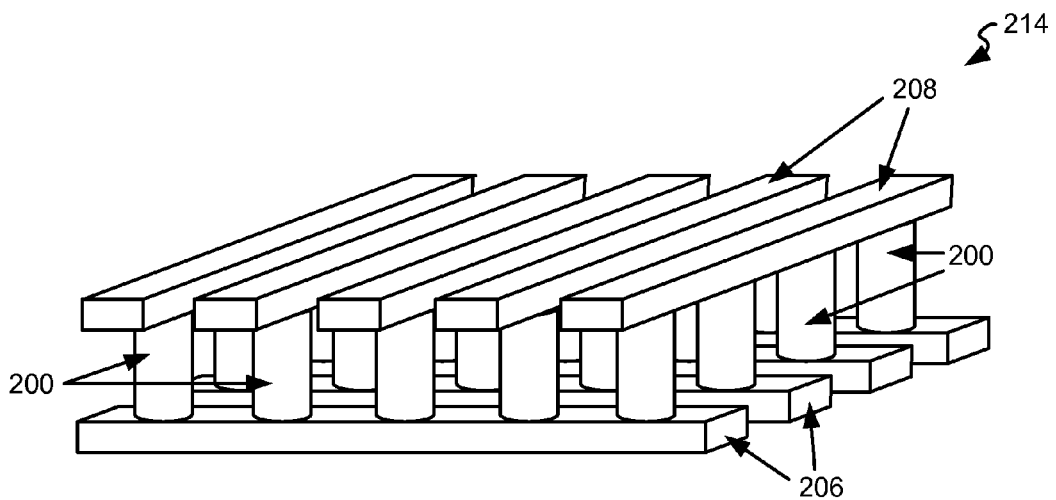
FIG. 2A is a simplified perspective view of a portion of a first memory level formed from a plurality of the memory cells of FIG. 1.

FIG. 2A is a simplified perspective view of a portion of a first memory level 214 formed from a plurality of the memory cells 200 of FIG. 1. For simplicity, the reversible resistivity-switching element 202 and the steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 2B:
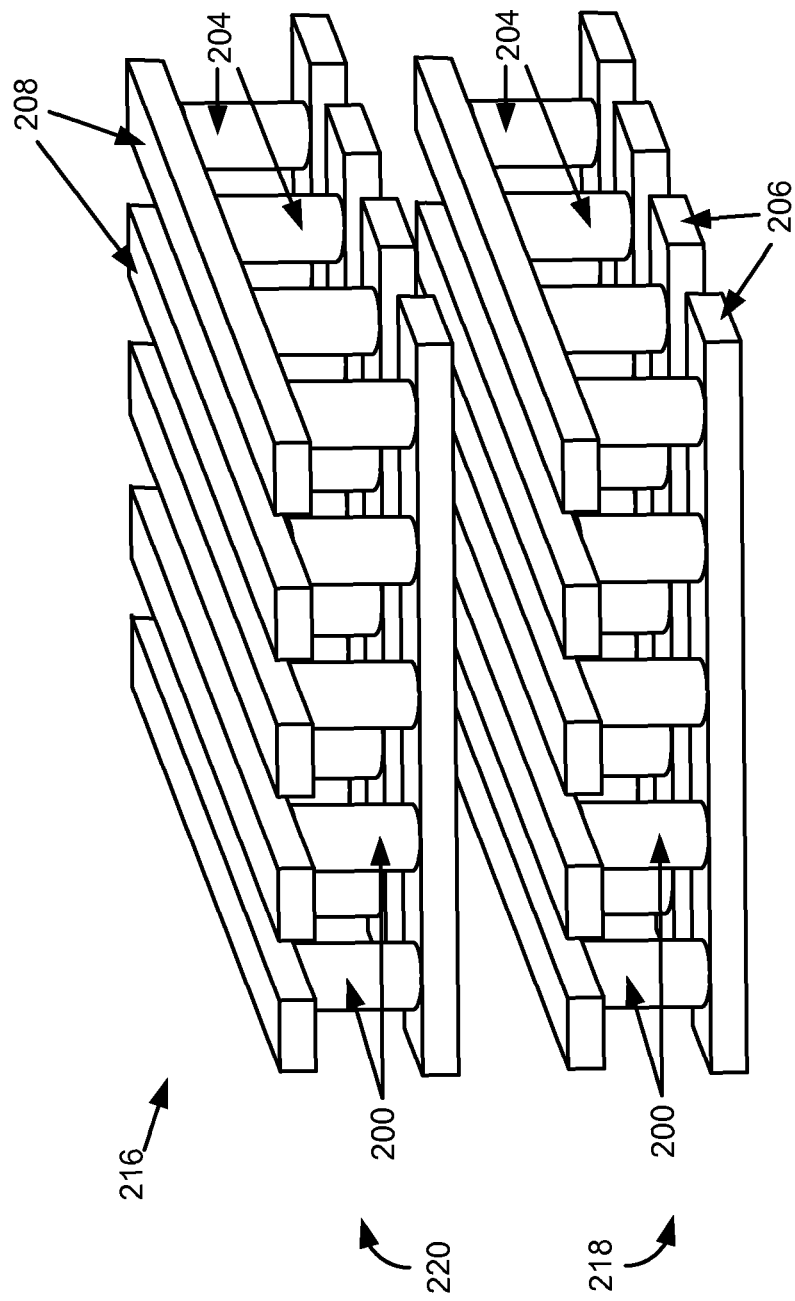
FIG. 2B is a simplified perspective view of a portion of a two memory levels formed from a plurality of the memory cells of FIG. 1.

FIG. 2B is a simplified perspective view of a portion of a monolithic three dimensional array 216 that includes a first memory level 218 positioned below a second memory level 220. In the embodiment of FIG. 2B, each memory level 218 and 220 includes a plurality of memory cells 200 in a cross-point array. It will be understood that additional layers (e.g., an inter-level dielectric) may be present between the first and second memory levels 218 and 220, but are not shown in FIG. 2B for simplicity. Other memory array configurations may be used, as may additional levels of memory.

Figure 2C:
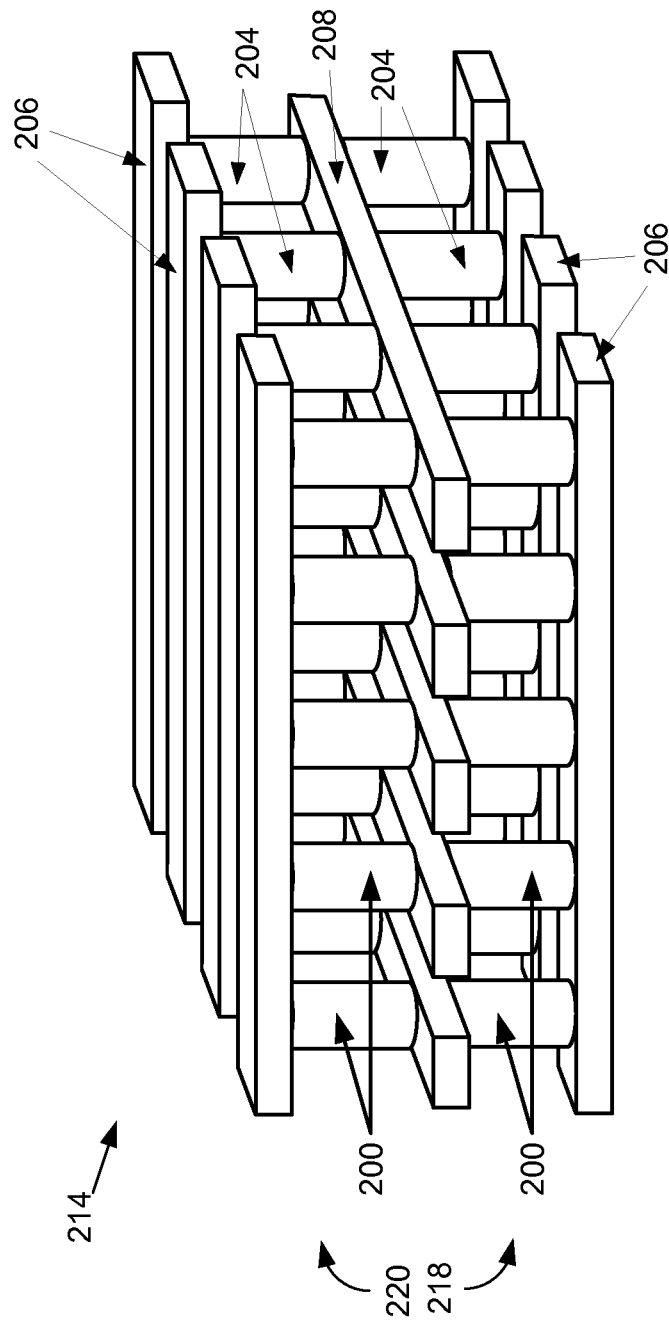
FIG. 2C is a simplified perspective view of a portion of a two memory levels formed from a plurality of the memory cells of FIG. 1.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 2C. Note that in some embodiments the orientation of the memory cells in the second level 220 is the opposite as the first level 218. For example, the memory cells in the second level 220 may be upside down relative to the memory cells in the first level 218.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1, 2A, 2B, 2C show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Bi-Layer Top Electrode

Figure 3A:
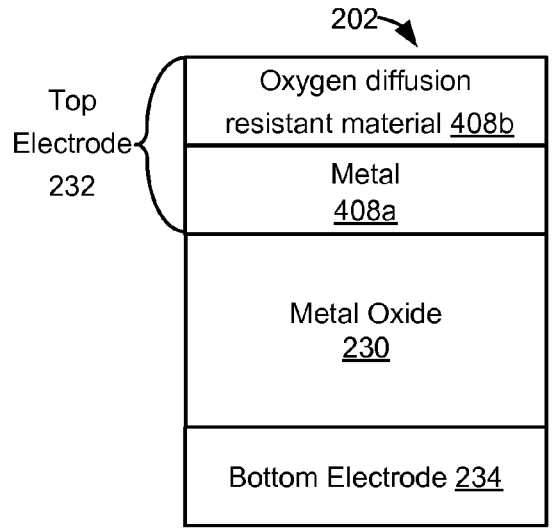
FIGS. 3A, 3B, 3C, and 3D depict embodiments of a reversible resistivity-switching having an oxygen diffusion resistant material in the top electrode.

FIG. 3A depicts one embodiment of a reversible resistivity-switching element 202 formed using an oxygen diffusion resistant material in the top electrode. The reversible resistivity-switching element 202 may be used in any of the example devices depicted in FIG. 1, 2A, 2B, or 2C; however, the reversible resistivity-switching element 202 is not limited to those example devices. The reversible resistivity-switching element 202 of FIG. 3A includes a bottom electrode 234, metal oxide region 230, and bi-layer top electrode 232. The bi-layer top electrode 232 includes a metal layer 408a and an oxygen diffusion resistant material 408b.

Figure 3B:
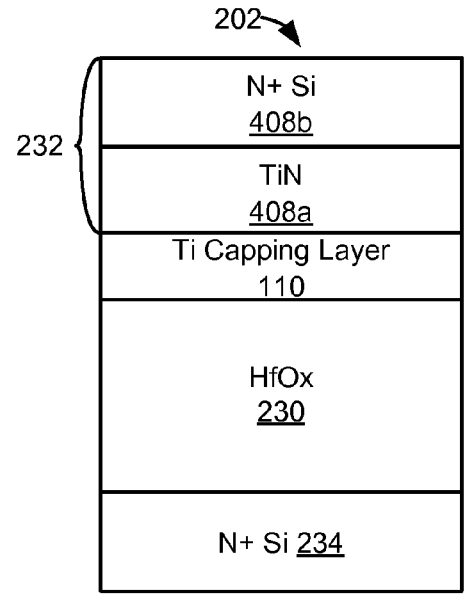

FIG. 3B depicts one embodiment of the reversible resistivity-switching element 202 of FIG. 3A. The bi-layer top electrode 232 has a layer of TiN 408a (metal layer) and a layer of heavily doped silicon for the oxygen diffusion resistant material 408b. The oxygen diffusion resistant material 408b is adjacent to the metal layer 408a and may prevent the metal layer 408b from oxidizing, or at least reduce the amount of oxidation that forms on the metal layer 408b. During device fabrication, the oxygen diffusion resistant material 408b may be formed over the metal layer 408b and may prevent oxygen from reaching the metal layer 408b, or at least reduce the amount of oxygen that reaches the metal layer 408b. As one alternative, the oxygen diffusion resistant material 408b might be N+Si. As another alternative, the oxygen diffusion resistant material 408b might be P+Si. One reason for heavily doping the silicon is to make it highly conductive. In one embodiment, the doping concentration of heavily doped silicon is anything equal or greater than $10^{19}/cm^3$. Note that the doping concentration could be lower. The bottom electrode 234 is formed from heavily doped silicon (n+Si) in this embodiment. The metal oxide 230 is hafnium oxide in this embodiment.

The embodiment of FIG. 3B includes a capping layer 110, which is titanium in this example. The capping layer 110 is optional. The capping layer 110 may serve as a gettering agent. For example, the capping layer 110 may attract oxygen from the metal oxide 230, which could help oxygen vacancies to form more easily. Thus, the forming voltage may be reduced. As noted, one example material for the capping layer is titanium, although another material might be used. The capping layer 110 may serve as a gettering agent during device operation. The capping layer 100 may also serve as a gettering agent when the device is not being operated, such as during device fabrication.

Figure 3C:
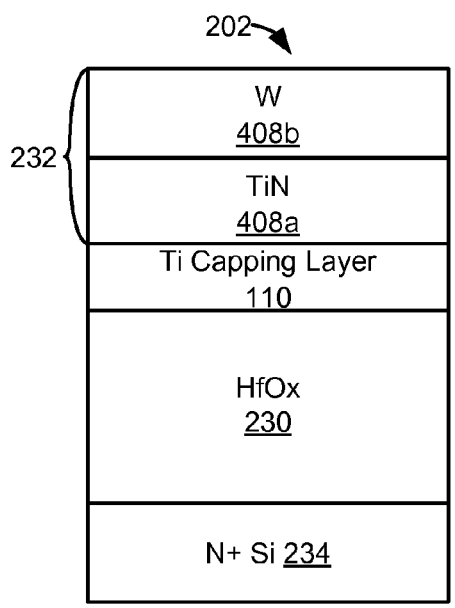
Figure 3D:
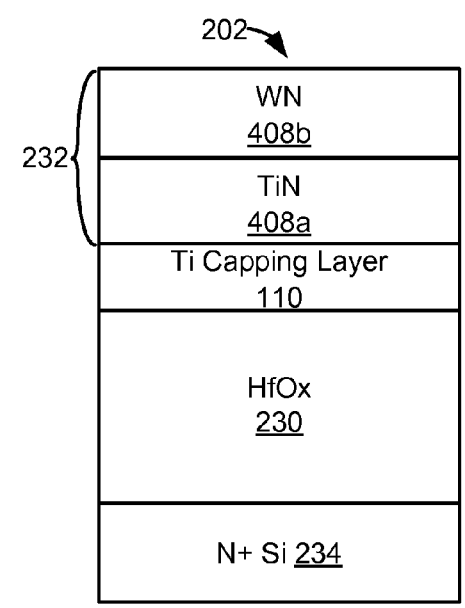

FIG. 3C depicts one embodiment of the reversible resistivity-switching element 202 of FIG. 3A. The bi-layer top electrode 232 has a layer of TiN 408a (metal layer) and a layer of tungsten (W) for the oxygen diffusion resistant material. FIG. 3D depicts one embodiment of the reversible resistivity-switching element 202 of FIG. 3A. The bi-layer top electrode 232 has a layer of TiN 408a (metal layer) and a layer of tungsten nitride (WN) for the oxygen diffusion resistant material.

The oxygen diffusion resistant material 408b may help to reduce or eliminate oxide from forming on the top surface of the metal layer 408a during fabrication of the reversible resistivity-switching element 202. This, in turn, may help reduce or eliminate oxide from forming between the bottom electrode 234 and metal oxide 230 during fabrication of the reversible resistivity-switching element 202. For example, if the top of the metal layer (e.g., TiN) 408a were to oxidize during fabrication of the reversible resistivity-switching element 202, then it may be possible for oxygen from the metal layer 408a to transfer to the bottom electrode 234 through the metal oxide 230 interface during, for example, a rapid thermal anneal (RTA). Therefore, preventing formation of oxide on the metal layer 408a may prevent or reduce oxidation of the bottom electrode 234. In some embodiments, the bottom electrode 234 is formed from silicon. Therefore, $SiO_2$ formation (during fabrication) between the bottom electrode 234 and metal oxide 230 may be reduced or eliminated.

Reducing or eliminating oxidation of the bottom electrode 234 may improve memory cell 200 performance. For example, if a portion of the bottom electrode 234 were to oxidize to form $SiO_2$, this could increase the forming voltage for the memory cell 200. As previously mentioned, the forming voltage refers to a voltage that puts the memory cell 200 into a low resistance state, typically, for the first time. In one embodiment, this is accomplished by forming conductive paths (which may be formed from oxygen vacancies) in the metal oxide 230. For various reasons, it may be desirable to have a lower forming voltage. One possible reason is that a lower forming voltage places less stress on the steering diode 204. If an $SiO_2$ layer is present in the memory cell 202, it may need to be broken down by the forming voltage in order for conductive paths to occur. The breakdown voltage of an $SiO_2$ layer may be a function of the thickness of $SiO_2$. However, an $SiO_2$ layer that is only about 1 nanometer (nm) thick could have a substantial impact. For example, nanometer scale $SiO_2$ may have a breakdown field of about 30 MV/cm. Therefore, for the sake of example, a 0.8 nm $SiO_2$ layer may have a breakdown voltage of about 2.4V. If such a breakdown voltage were needed, it may increase the forming voltage. However, embodiments disclosed herein reduce or eliminate an $SiO_2$ layer at the bottom electrode 234 (e.g., between the bottom electrode 234 and metal oxide 230). This may help to reduce the forming voltage. Reducing or eliminating the $SiO_2$ layer at the bottom electrode 234 may also reduce the SET and/or RESET voltage.

The bi-layer top electrode 232 may have other desirable properties. In some embodiments, the oxygen diffusion resistant material 408b reduces the amount of heat that is transferred away from the metal oxide 230 by reducing the amount of heat transferred away from the metal layer 408a. As previously discussed, in some embodiments, conductive filaments may be broken during a RESET operation. As one possibility, the conductive filaments may be formed from oxygen vacancies in the $MeO_x$. Therefore, a RESET may remove some of the oxygen vacancies in the $MeO_x$. It may be that heat has a role in breaking the oxygen vacancies in the $MeO_x$. Moreover, in some embodiments, the conductive filaments may tend to be broken near the top electrode/metal oxide interface. Thus, it may be beneficial for heat to be maintained at the top electrode/metal oxide 230 interface in order to break the conductive filaments. Therefore, increasing the thermal resistance of the top electrode 232 may improve the ability to RESET the memory cell 202. For example, the reset current may be lower as a result of increased thermal resistance of the top electrode 232.

Figure 4A:
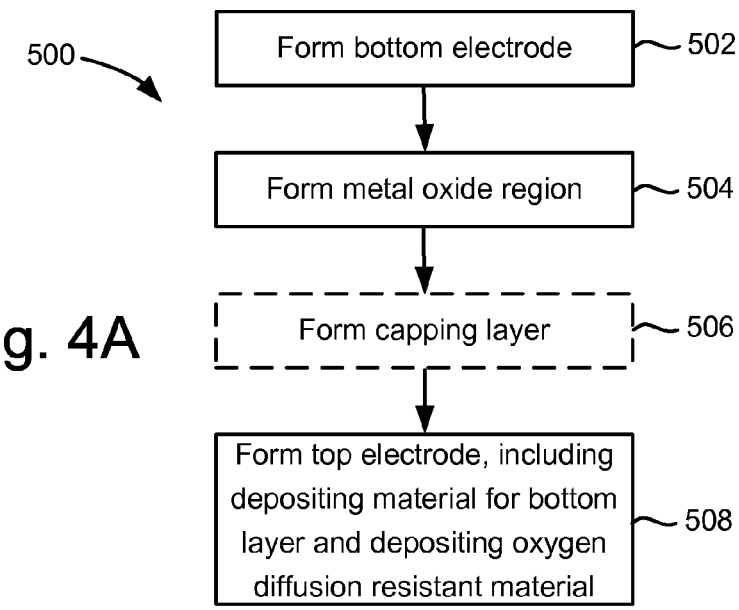
FIG. 4A is a flowchart illustrating one embodiment of a process of fabricating a reversible resistivity-switching element having an oxygen diffusion resistant material in the top electrode.

FIG. 4A is a flowchart illustrating one embodiment of a process 500 of fabricating a reversible resistivity-switching element 202 having an oxygen diffusion resistant material. Process 500 may be used to fabricate a reversible resistivity-switching element 202 such as those depicted in FIGS. 1, 3A, 3B, 3C and 3D. The process 500 could be used as a part of fabricating a memory array such as the examples depicted in FIGS. 2A-2C. It will be understood that other process flow steps to form structures such as a steering diode 204, and conductors 206, 208 might be performed before and/or after the steps of process 500.

In step 502, a bottom electrode 234 of the reversible resistivity-switching element 202 is formed. In one embodiment, forming a bottom electrode 234 includes depositing a layer of material for the bottom electrode and later etching this material (along with other materials) to form a memory cell 200 (and possibly other elements, such as steering elements 204). Further details of one embodiment are discussed in the more detailed flow of FIG. 5B.

In step 504, a metal oxide region 230 is formed above the bottom electrode 234. The metal oxide could be, but is not limited to, $HfO_x$. In optional step 506, a capping layer 110 is formed above the metal oxide region 230. Steps 540 and 506 may be achieved by depositing layers of materials and later etching to form memory cells 200. In one embodiment, a thermal anneal is performed after step 504. This thermal anneal may crystallize the metal oxide region 230. A thermal anneal to crystallize the metal oxide region 230 may be performed at a different stage of device fabrication.

In step 508, a top electrode 232 is formed. Forming the top electrical electrode 232 may include depositing a material for a bottom layer 408a and depositing an oxygen diffusion resistant material 408b over the material for the bottom layer 408a. The oxygen diffusion resistant material 408b may be deposited in situ, without air break. In one embodiment, step 508 includes placing a wafer in a chamber and depositing a layer of titanium nitride. The oxygen diffusion resistant material 408b is then deposited over the titanium nitride without allowing the titanium nitride to be exposed to oxygen. For example, there is no "air break" between a step of depositing TiN and a step of depositing Si (or W or WN).

Figure 4B:
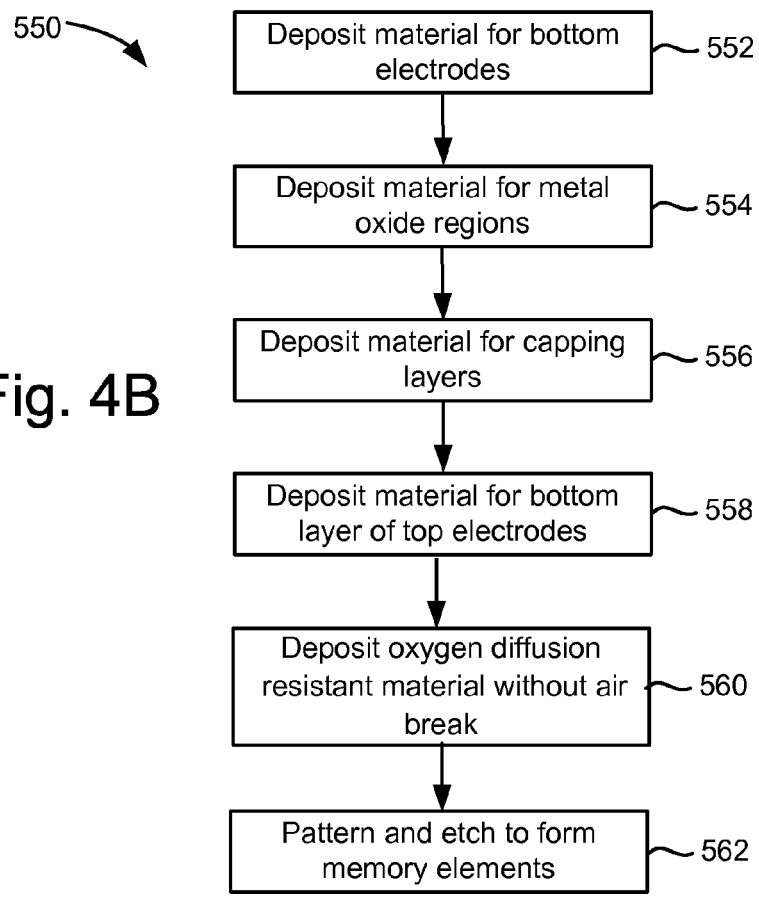
FIG. 4B is a flowchart of one embodiment of a process of fabricating a group of reversible resistivity-switching elements having an oxygen diffusion resistant material in the top electrode.
Figure 5A:
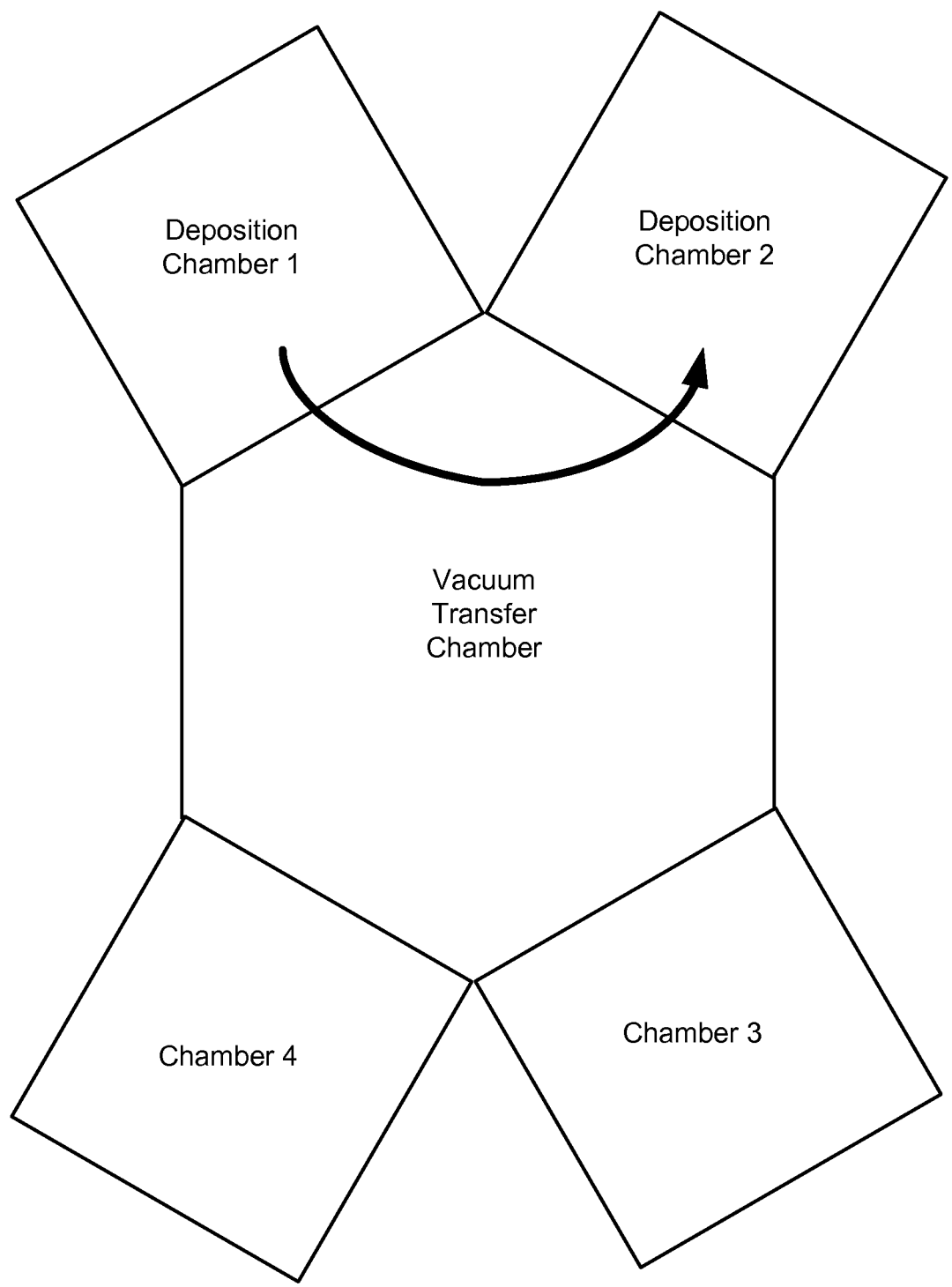
FIG. 5A depicts a block diagram of an example of a cluster tool having four process chambers and a vacuum transfer chamber.

FIG. 4B is a flowchart of one embodiment of a process 550 of fabricating a reversible resistivity-switching elements 202 using an oxygen diffusion resistant material in the top electrode 232. Process 550 is one embodiment of process 500 of FIG. 4A. Note that FIG. 4B describes a flow for fabricating many memory cells. In some embodiments, at least some steps occur in a cluster tool that has different chambers in same tool. There may be a vacuum "transfer chamber" and two or more process chambers. FIG. 5A depicts a block diagram of an example of a cluster tool having four process chambers and a vacuum transfer chamber. The wafer may be transferred through the vacuum transfer chamber when moving the wafer from one chamber to another. Therefore, exposure to air (and oxygen) may be prevented between process steps. As one example, titanium nitride may be deposited with the wafer in a first chamber. Then, the wafer may be moved through a vacuum chamber to a second chamber, where silicon is deposited. By moving the wafer through the vacuum chamber, exposure of the deposited titanium nitride to air is prevented. Other techniques may be used to prevent exposure to oxygen between deposition steps.

In step 552, material for bottom electrodes 234 of reversible resistivity-switching elements 202 is deposited. As one example, silicon is deposited. The silicon may be doped as deposited, and/or doped after deposition. The material for bottom electrodes 234 can be deposited using a variety of techniques including, but not limited to, chemical vapor deposition (CVD), physical vapor deposition (PVD), atomic layer deposition (ALD), and sputtering.

If the reversible resistivity-switching element 202 is being fabricated over a steering element, step 552 may include depositing the material for the bottom electrodes over a layer of material for the top portion of the steering elements. On the other hand, if the reversible resistivity-switching element 202 is being fabricated below a steering element, then step 552 might include depositing the material for bottom electrodes 234 over material for bottom conductors 206.

In step 554, material for metal oxide regions 230 is deposited above the material for the bottom electrodes 234. As one example, a layer of $HfO_x$ is deposited. In one embodiment, the $HfO_x$ is deposited in situ. Therefore, the $HfO_x$ may be deposited over the material for the bottom electrode 234 without air break. The $MeO_x$ can be deposited using a variety of techniques including, but not limited to, chemical vapor deposition (CVD), physical vapor deposition (PVD), atomic layer deposition (ALD), and sputtering. In one embodiment, a thermal anneal is performed after step 554. This thermal anneal may crystallize the materials for the metal oxide regions. A thermal anneal to crystallize the materials for the metal oxide region 230 may be performed at a different stage of device fabrication.

In optional step 556, material for capping layers 110 is deposited above the material for the metal oxide region 230. As one example, a layer of titanium is deposited. The capping layer 110 can be deposited using a variety of techniques including, but not limited to, chemical vapor deposition (CVD), physical vapor deposition (PVD), atomic layer deposition (ALD), and sputtering.

In step 558, material for a bottom layer 408a of the top electrodes 232 is deposited above the material for the capping layers. As one example, a layer of TiN is deposited. In one embodiment, the TiN is deposited with the wafer in a first chamber of a cluster tool. At this time, a vacuum condition is established in a vacuum transfer chamber. The material for a bottom layer 408a of the top electrodes 232 can be deposited using a variety of techniques including, but not limited to, chemical vapor deposition (CVD), physical vapor deposition (PVD), atomic layer deposition (ALD), and sputtering.

In step 560, an oxygen diffusion resistant material 408b is deposited over the material for the bottom layers 408a. As one example, a layer of silicon is deposited over the TiN. The silicon may be heavily doped for low resistance. The doping may be as deposited or doping may be performed after deposition. As another example, a layer of tungsten may be deposited over the TiN. As still another example, a layer of tungsten nitride may be deposited over the TiN. In one embodiment, the oxygen diffusion resistant material is deposited in situ, without air break. For example, the oxygen diffusion resistant material is deposited in the same chamber as the TiN without allowing the TiN that was deposited in step 558 to be exposed to air. In one embodiment, a cluster tool is used, wherein the wafer is moved from a first chamber through a vacuum chamber to a second chamber, while the vacuum condition is maintained. The silicon may then be deposited while the wafer is in the second chamber. Therefore, with either technique, exposure of the TiN to air (and oxygen) is prevented. The oxygen diffusion resistant material 408b can be deposited using a variety of techniques including, but not limited to, chemical vapor deposition (CVD), physical vapor deposition (PVD), atomic layer deposition (ALD), and sputtering.

Figure 5B:
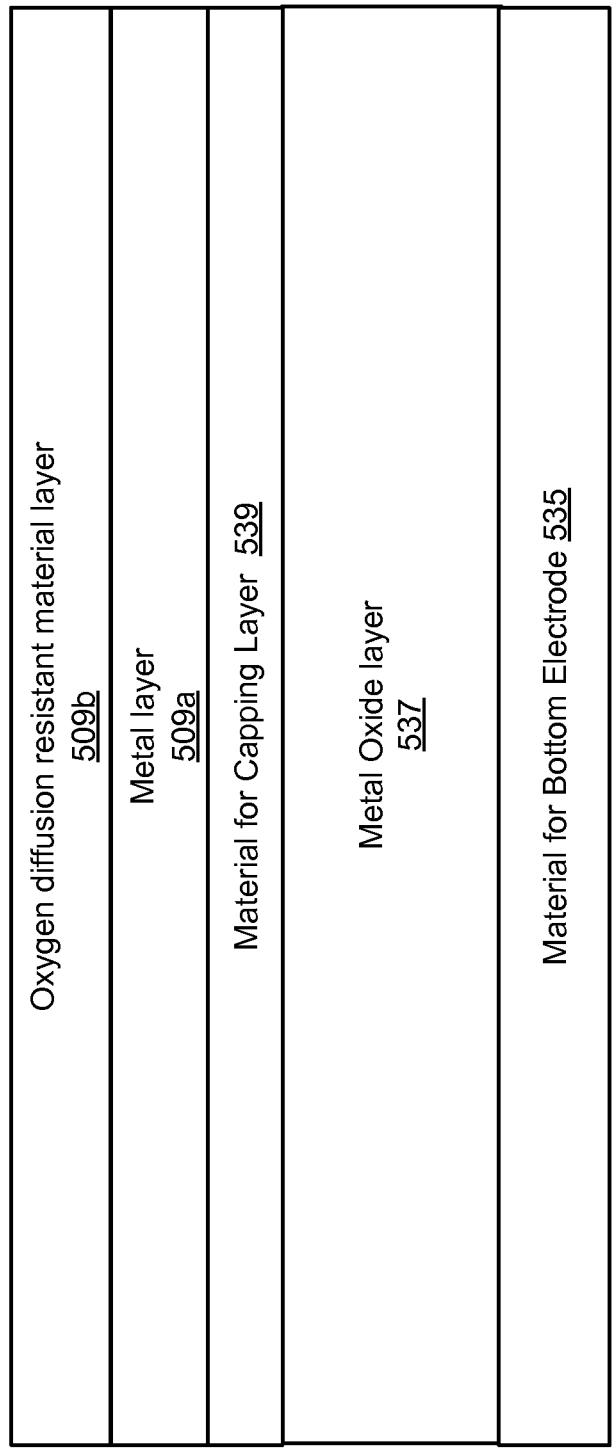
FIG. 5B depicts results after deposition steps in the flow of FIG. 4B.

FIG. 5B depicts results after step 560. FIG. 5B depicts a layer of material for the bottom electrode 535, metal oxide layer 537, material for capping layer 539, metal layer (for lower part of top electrode) 509a, and oxygen diffusion resistant material 509. FIG. 5B shows only the materials for the reversible resistivity-switching element 202. Depending on where the element 202 is being formed relative to other elements (such as, for example, steering element 204, conductors 206, 208) there may be other layers above and/or below the layers depicted in FIG. 5B.

In step 562, patterning and etching is performed to form structures for individual memory cells. The patterning and etching may also etch to form diode steering elements 204. As noted, the steering element 204 could be above or below the reversible resistivity-switching element 202. After step 562 multiple structures such as depicted in any one of FIGS. 3A-3D are formed.

Note that, together, steps 552 and 562 are one embodiment of step 502. Likewise, together, steps 554 and 562 are one embodiment of step 504. Likewise together, steps 556 and 562 are one embodiment of step 506. Likewise together, steps 558, 560 and 562 are one embodiment of step 508. Note that the flow of FIG. 4B is one example of how to fabricate devices having a bi-layer top electrode; however, other techniques could be used.

Trap Passivation

Figure 6A:
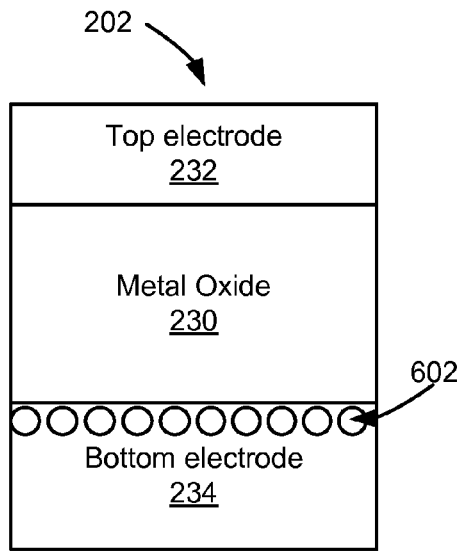
FIGS. 6A, 6B, and 6C depict embodiments of memory cells having an interface trap passivation material.
Figure 6B:
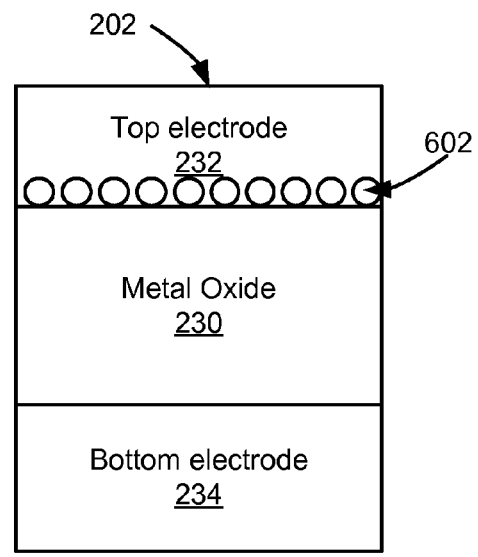
Figure 6C:
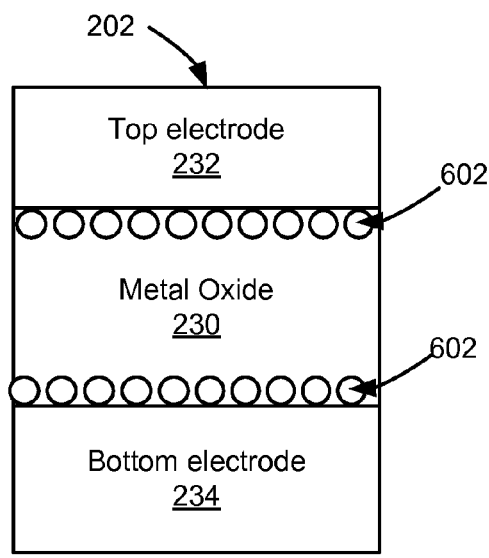

FIG. 6A depicts one embodiment of a reversible resistivity-switching element 202 having an interface trap passivation material 602 in a bottom electrode 234. FIG. 6B depicts one embodiment of a reversible resistivity-switching element 202 having an interface trap passivation material 602 in a top electrode 234. FIG. 6C depicts one embodiment of a reversible resistivity-switching element 202 having an interface trap passivation material 602 in a metal oxide region 230. The reversible resistivity-switching element 202 may be used in any of the example devices depicted in FIG. 1, 2A, 2B, or 2C; however, the reversible resistivity-switching element 202 is not limited to those example devices. The element 202 includes a bottom electrode 234, a metal oxide 230, and a top electrode 232. As noted, there is a trap passivation material 602 somewhere in the device 202. Examples of the trap passivation material 602 include, but are not limited to, fluorine, nitrogen, hydrogen, and deuterium. The bottom electrode 234 (also referred to as a "first electrically conductive region") may be formed from silicon, SiGe, etc. In some embodiments, the bottom electrode 234 is doped (e.g., heavily doped for high conductivity).

In some embodiments, the trap passivation material 602 passivates dangling bonds. This may lead to fewer traps at the interface between the bottom electrode 234 and the metal oxide 230. For example, there may be fewer traps at an $Si/HfO_x$ interface. Reducing the traps may result in a higher effective work function for the top electrode 232, which may improve memory cell performance. This may also lead to fewer traps at the interface between the top electrode 232 and the metal oxide 230.

Figure 7A:
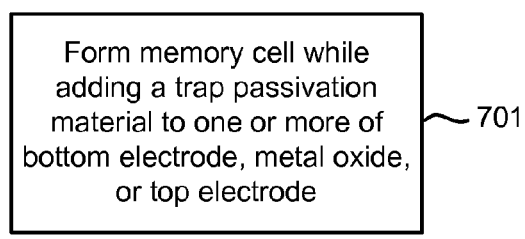
FIG. 7A is a flowchart illustrating one embodiment of a process of fabricating a memory cell using a trap passivation material.

FIG. 7A is a flowchart illustrating one embodiment of a process of fabricating a memory cell using an interface trap passivation material. The process may be used to fabricate a reversible resistivity-switching element 202 such as the examples depicted in FIG. 6A-6C. The process could be used as a part of fabricating devices such as the examples depicted in FIGS. 1 and 2A-2C. Thus, it will be understood that other process flow steps to form structures such as a steering diode 204, and conductors 206, 208 might be performed before and/or after the steps of the process.

In step 701, a resistive random access memory (RRAM) element is formed while adding a passivation material that passivates traps at either a first interface between a metal oxide region and a bottom electrode and/or a second interface between the metal oxide region and a top electrode. Thus, the memory element has a bottom electrode that includes a first electrically conductive material, a metal oxide region adjacent to the first electrically conductive region, and a top electrode that includes a second electrically conductive material adjacent to the metal oxide region. Forming the resistive random access memory (RRAM) element includes adding a trap passivation material to one or more of the first electrically conductive material, the metal oxide region, or the second electrically conductive material.

FIG. 7B is a flowchart of one embodiment of a process 720 of forming a bottom electrode, while passivating traps. Process 720 is one embodiment of FIG. 7A. In step 722, an electrically conductive material is deposited. Step 722 may include depositing a layer of electrically conductive material that will be used to form the bottom electrode 234 of many different resistivity-switching elements 202. For example, a layer of silicon may be deposited for bottom electrodes 234. The silicon may be doped as deposited, or doped after deposition.

In step 724, a trap passivation material is implanted into the electrically conductive material. Example materials for implanting include, but are not limited to, fluorine, hydrogen, nitrogen, and deuterium. In some embodiments, the trap passivation material is implanted with a suitable energy such that it is near the top surface of the electrically conductive material that was deposited in step 722. However, the trap passivation material could be implanted at a different target depth in the electrically conductive material. The trap passivation material is not required to be implanted throughout the material for the bottom electrode; however, implanting the trap passivation material throughout the material for the bottom electrode is not precluded. The concentration of the trap passivation material may be uniform or non-uniform. For example, the concentration may be greater near the top surface (e.g., the surface that will be adjacent to the $MeO_x$).

In step 726, pattering and etching is performed to form a number of bottom electrodes 234. Note that this etching step may etch other materials that were also deposited (before or after the materials for the bottom electrode). For example, step 726 could etch to form a number of memory cells that each include a bottom electrode.

FIG. 7C is a flowchart of one embodiment of a process 740 of forming a bottom electrode, while passivating traps. In process 740, passivating traps is performed in situ (e.g., while the material for bottom electrodes is being deposited). Process 740 is one embodiment of FIG. 7A. In step 742, an electrically conductive material is deposited while adding trap passivation material to the electrically conductive material. For example, a layer of silicon is deposited with trap passivation material being added at least at the end of depositing the silicon. In one embodiment, the electrically conductive material and the trap passivation material are deposited using chemical vapor deposition (CVD). The mixture of gases in the deposition chamber may be adjusted during deposition to achieve desired results. For example, initially a combination such as silane ($SiH_4$) and a dopant such phosphene ($PH_3$) or arsine ($AsH_3$) may be used to form heavily doped polysilicon. Later, while still depositing the heavily doped polysilicon, a suitable gas may be introduced into the deposition chamber in order to incorporate fluorine, hydrogen, nitrogen, and/or deuterium into the heavily doped polysilicon. This way, the trap passivation material will be present at least near the top surface of the silicon. Note that the trap passivation material may be incorporated at any desired level of the electrically conductive material.

In step 744, pattering and etching is performed to form a number of bottom electrodes 234. Note that this etching step may etch other materials that were also deposited (before or after the materials for the bottom electrode). For example, step 744 could etch to form a number of memory cells that each include a bottom electrode 234.

Figure 7D:
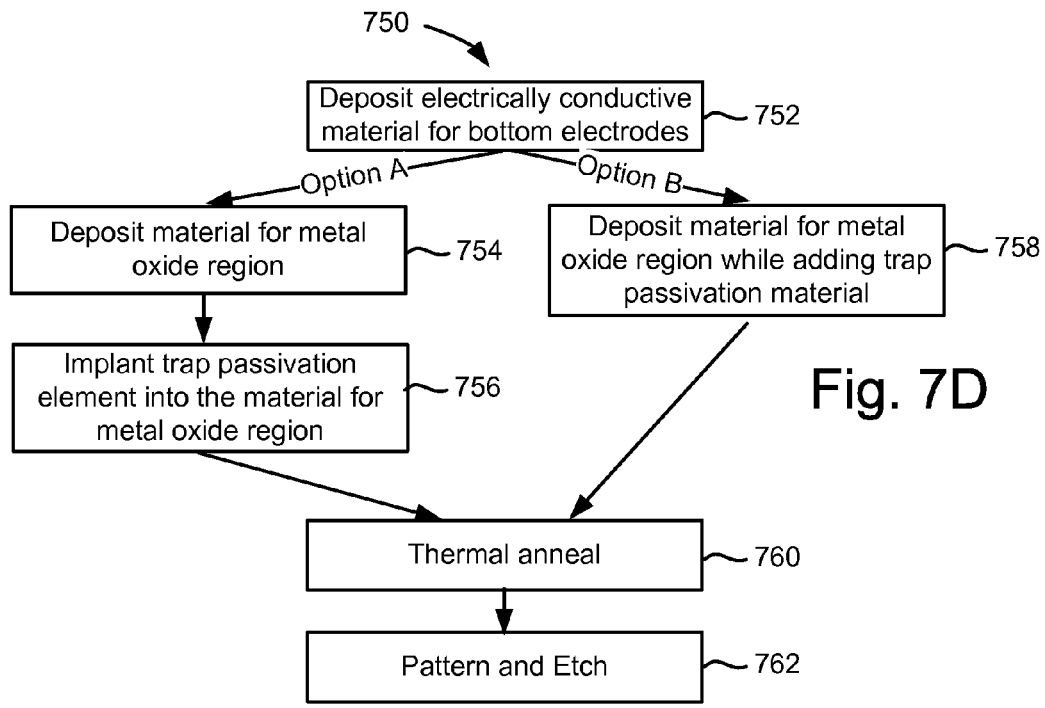
FIG. 7D is a flowchart illustrating one embodiment of a process of incorporating a trap passivation material in a metal oxide region.

FIG. 7D is a flowchart of one embodiment of a process 750 of forming a memory cell, while passivating traps between a metal oxide region and one or more electrodes. In process 750, material for passivating traps is added to the metal oxide region. A thermal anneal is later performed to cause the material to diffuse to passivate traps between the metal oxide 230 and the bottom electrode 234 and/or the top electrode 232. The material for passivating traps may be added in situ to the metal oxide or implanted into the metal oxide after deposition. Process 750 is one embodiment of FIG. 7A. In step 752, an electrically conductive material is deposited. For example, a layer of silicon is deposited.

Next either Option A or Option B is performed. In Option A, material for the metal oxide region is deposited, in step 754. Then, trap passivation material is implanted into the metal oxide, in step 756. Example materials for implanting include, but are not limited to, fluorine, hydrogen, nitrogen, and deuterium.

In Option B, while the metal oxide is being deposited, trap passivation material is added in situ. Example trap passivation materials include, but are not limited to, fluorine, hydrogen, nitrogen, and deuterium.

In step 760, a thermal anneal is perform. The thermal anneal may cause the trap passivation material to diffuse to passivate the interface between the metal oxide 230 and the bottom electrode 234. The thermal anneal may also cause the trap passivation material to diffuse to passivate the interface between the metal oxide 230 and the top electrode 232. Note that the thermal anneal could be performed at a later stage.

In step 762, pattering and etching is performed to form memory cells from the materials previously deposited. Note that this etching step may etch other materials that were also deposited.

Figure 7E:
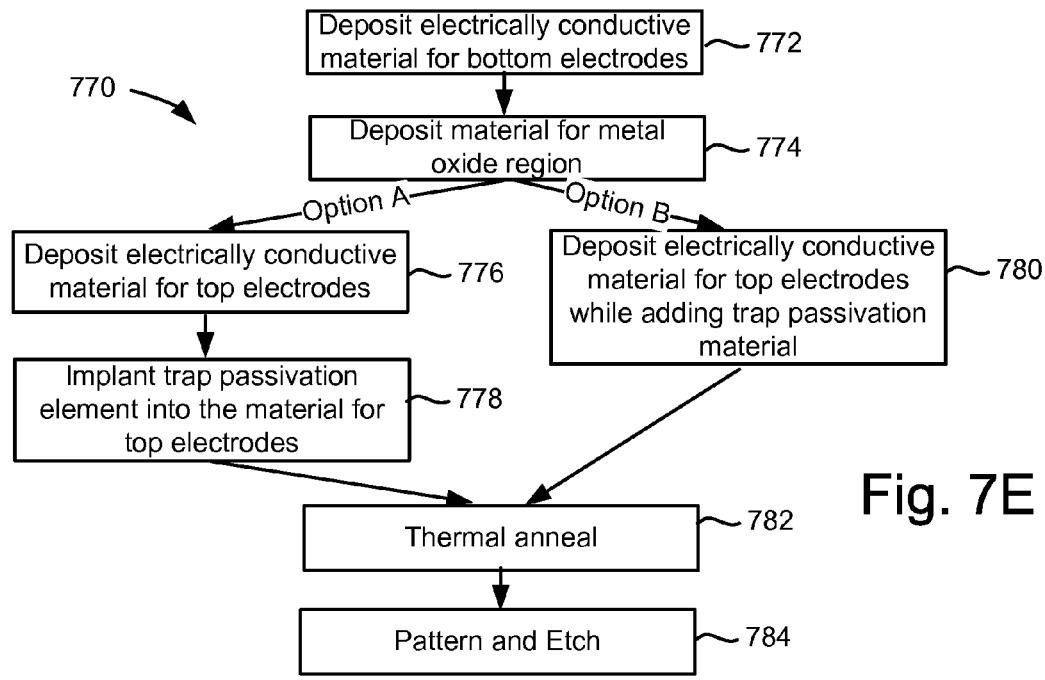
FIG. 7E is a flowchart illustrating one embodiment of a process of incorporating a trap passivation material in a top electrode.

FIG. 7E is a flowchart of one embodiment of a process 770 of forming a bottom electrode, while passivating traps. In process 750, material for passivating traps is added to the metal oxide region. A thermal anneal is later performed to cause the material to diffuse to passivate traps between the metal oxide 230 and the bottom electrode 234 and/or the top electrode 232. The material for passivating traps may be added in situ to the metal oxide or implanted into the metal oxide after deposition. Process 750 is one embodiment of FIG. 7A. In step 752, an electrically conductive material is deposited. For example, a layer of silicon is deposited.

Next either Option A or Option B is performed. In Option A, material for the metal oxide region is deposited, in step 754. Then, trap passivation material is implanted into the metal oxide, in step 756. Example materials for implanting include, but are not limited to, fluorine, hydrogen, nitrogen, and deuterium.

In Option B, while the metal oxide is being deposited, trap passivation material is added in situ. Example trap passivation materials include, but are not limited to, fluorine, hydrogen, nitrogen, and deuterium.

In step 760, a thermal anneal is perform. The thermal anneal may cause the trap passivation material to diffuse to passivate the interface between the metal oxide 230 and the bottom electrode 234. The thermal anneal may also cause the trap passivation material to diffuse to passivate the interface between the metal oxide 230 and the top electrode 232. Note that the thermal anneal could be performed at a later stage.

In step 762, patterning and etching is performed to form memory cells from the materials previously deposited. Note that this etching step may etch other materials that were also deposited.

Bi-Layer Capping Layer

Figure 8A:
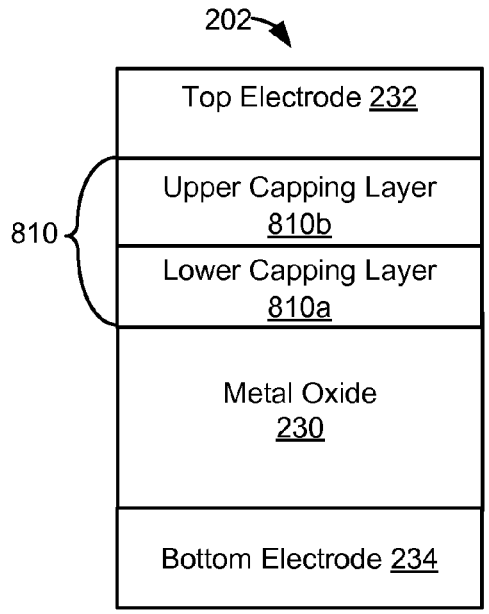
FIGS. 8A, 8B, 8C and 8D depict embodiments of a reversible resistivity-switching element having a bi-layer capping layer.

One embodiment includes a reversible resistivity-switching element 202 having a bi-layer capping layer between the metal oxide 230 and the top electrode 232. FIG. 8A depicts one embodiment having a bi-layer capping layer 810. The reversible resistivity-switching element 202 may be used in any of the example devices depicted in FIG. 1, 2A, 2B, or 2C; however, the reversible resistivity-switching element 202 is not limited to those example devices. The reversible resistivity-switching element 202 of FIG. 8A includes a bottom electrode 234, metal oxide region 230, bi-layer capping layer 810, and top electrode 232. The bi-layer capping layer 810 includes a lower capping layer 810a and an upper capping layer 810b.

Figure 8B:
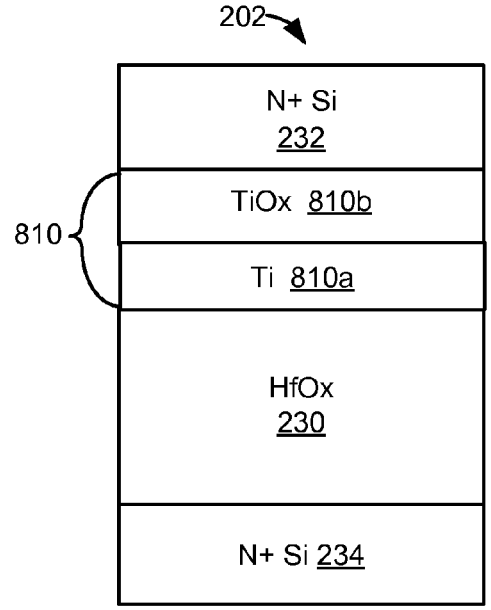
Figure 8C:
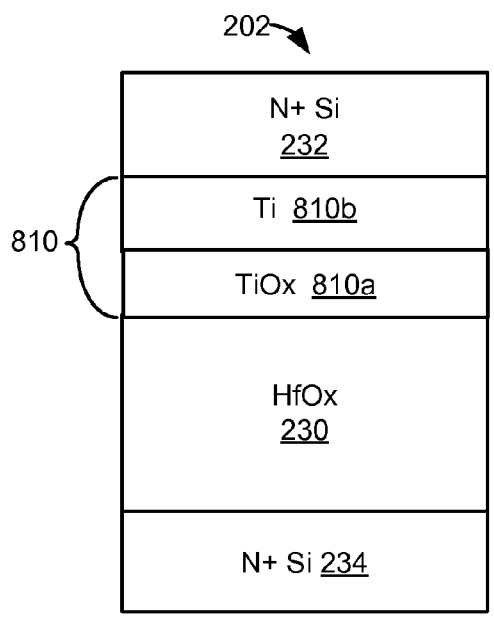

FIG. 8B depicts one embodiment of the element 202 of FIG. 8A. In this embodiment, the lower capping layer 810a is titanium and the upper capping layer 810b is titanium oxide. The bottom electrode 234 is N+Si, the metal oxide 230 is $HfO_x$, and the top electrode is N+Si. Note that other materials could be used for the bottom electrode 234 and the top electrode 232. Also note that other metal oxides could be used for region 230. FIG. 8C depicts one embodiment of the element 202 of FIG. 8A. In embodiment of FIG. 8C, the lower capping layer 810a is titanium oxide and the upper capping layer 810b is titanium.

Figure 8D:
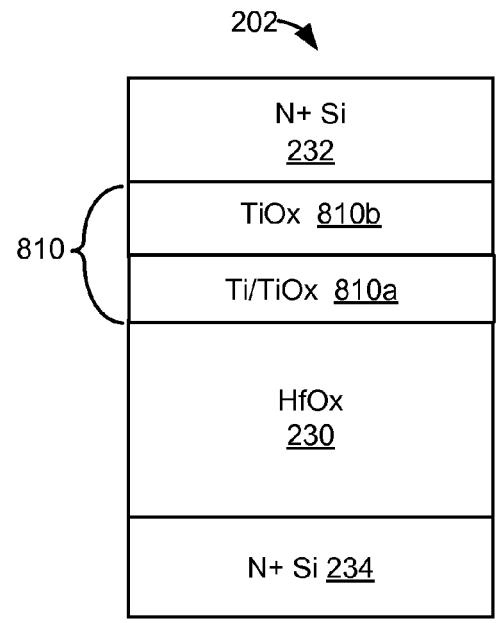

Note that in some embodiments, the lower capping layer 810a is un-reacted titanium, as deposited. However, some or all of the lower capping layer 810a may become oxidized during fabrication of the memory cell. FIG. 8D depicts an embodiment in which the lower capping layer 810a is some combination of titanium and titanium oxide. In some embodiments, all of the titanium becomes TiOx, such that no un-reacted Ti remains in the capping layer 810.

At least a portion of the bi-layer capping layer 810 may act as a gettering agent. For example, un-reacted Ti in the capping layer 810 may act as a gettering agent. The capping layer 810 may act as a gettering agent during device operation. The capping layer 810 may act as a gettering agent when the device is not being operated, such as during device fabrication. In one embodiment, the lower capping layer 810a includes un-reacted titanium (at least when deposited). Therefore, the lower capping layer 810 may act as a gettering agent in some embodiments. In one embodiment, the upper capping layer 810b includes un-reacted titanium (at least when deposited). Therefore, the upper capping layer 810b may act as a gettering agent in some embodiments.

Note that having a high work function of the top electrode 232 may lead to good device performance. The presence of the $TiO_x$ near the metal oxide 230 may cause dipoles, which may shift (e.g., increase) the work function of the top electrode 232. The $TiO_x$ may be in the upper capping layer 810b. Note that in some embodiments at least some of the lower capping layer 810a may include $TiO_x$, at least in the finished memory cell. If the metal oxide 230 is $HfO_x$, then the dipoles may be Hf—O—Ti dipoles. The metal oxide 230 may be something other than $HfO_x$, in which case a different type of dipole may be formed. As noted, increasing the work function of the top electrode 232 may improve performance of the memory cell. In some embodiments, the amount of power that is needed for cycling the metal oxide 230 may be reduced due to the bi-layer capping layer 110.

Moreover, the un-reacted titanium layer that may be deposited for the lower capping layer 810a may be quite thin, which may have additional benefits. For example, a thin titanium layer may be more compatible with an HF or other cleaning process than a thicker un-reacted titanium layer for the following reasons. It may be possible that un-reacted titanium could be undesirably etched during fabrication of the memory cells. For example, after depositing layers of materials for the memory cell 200, one or more etching steps may be performed. As one example, an etch with HF could be performed. As one specific example, when etching to form stacks of memory cells, a portion of the capping layer 810 may be exposed to an etchant (such as HF). An etchant such as HF may etch some of the un-reacted titanium which could undercut the stack. It may be that the portion of the stack above the un-reacted titanium could even fall.

However, it may be that a bi-layer capping layer 810 that includes both a layer of un-reacted titanium and a layer of $TiO_x$ is less susceptible to undesirable etching. One possible reason for this is that the (un-reacted) Ti layer may be thinner, as compared to a capping layer that does not have the $TiO_x$ layer. A thinner layer of un-reacted Ti may be less susceptible to undesirable etching from, for example HF. Moreover, a bi-layer capping layer 810 that includes both a layer of un-reacted titanium (at least as deposited) and a layer of $TiO_x$ may still serve as a gettering agent.

Figure 9:
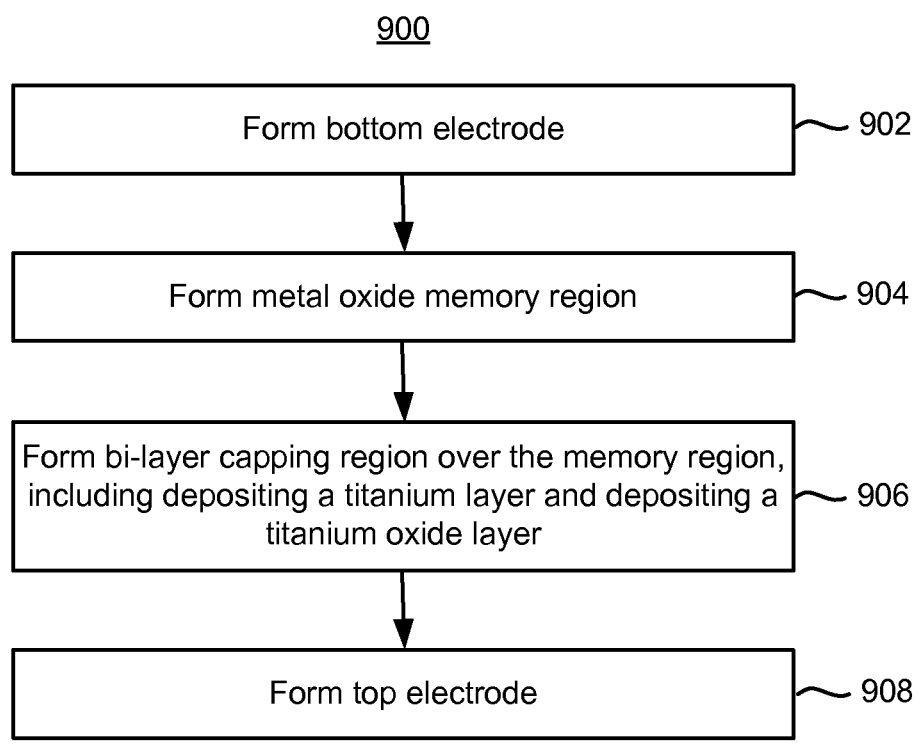
FIG. 9 is a flowchart illustrating one embodiment of a process of fabricating a reversible resistivity-switching element having a bi-layer capping layer.

FIG. 9 is a flowchart illustrating one embodiment of a process 900 of fabricating a reversible resistivity-switching element 202 having a bi-layer capping layer 810. Process 900 may be used to fabricate a reversible resistivity-switching element 202 such as those depicted in FIGS. 8A-8D. The process 900 could be used as a part of fabricating memory devices such as the examples depicted in FIGS. 1, 2A-2C. Thus, it will be understood that other process flow steps to form structures such as a steering diode 204, and conductors 206, 208 might be performed before and/or after the steps of process 900. Process 900 does not describe all process flow steps.

In step 902, a bottom electrode 234 of the memory cell 200 is formed. In one embodiment, forming a bottom electrode includes depositing material for bottom electrodes and later etching this material (along with other material) to form memory cells.

In step 904, a metal oxide region 230 is formed above the bottom electrode 234. In one embodiment, forming a metal oxide region 230 includes depositing material for metal oxide regions 230 and later etching this material (along with other material) to form memory cells. In one embodiment, a thermal anneal is performed after step 904. This thermal anneal may crystallize the metal oxide region 230. A thermal anneal to crystallize the metal oxide region 230 may be performed at a different stage of device fabrication.

Figure 10A:
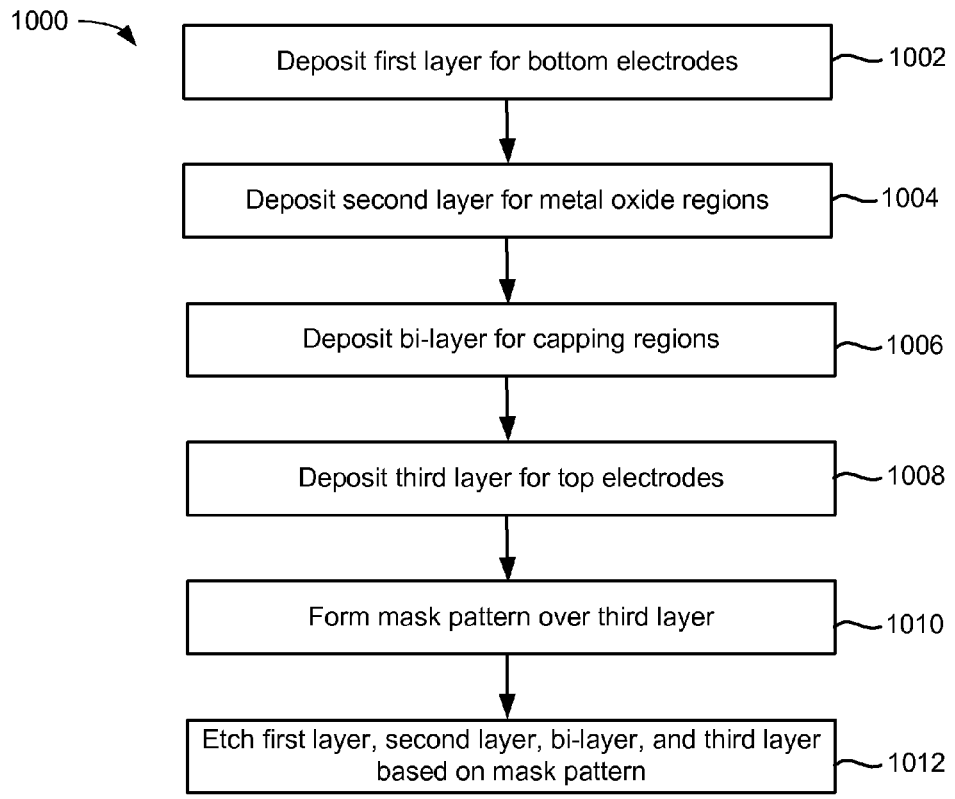
FIG. 10A is a flowchart of one embodiment of a process of fabricating reversible resistivity-switching elements having a bi-layer capping layer.
Figures 10B, 10C:
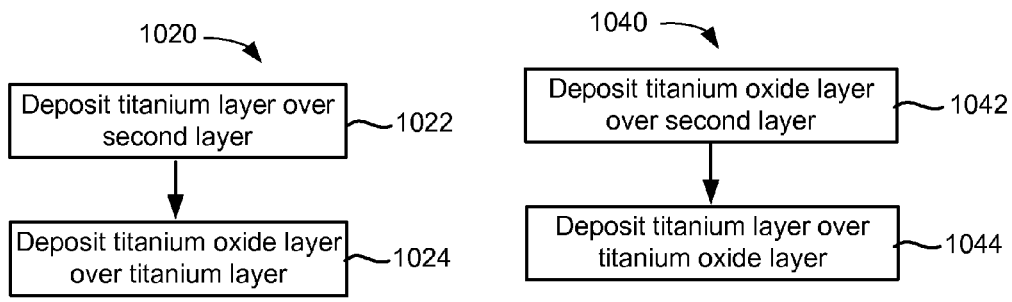
FIGS. 10B and 10C depict embodiments of depositing a bi-layer capping layer.

In step 906, a bi-layer capping layer 810 is formed above the metal oxide region 230. Forming the bi-layer capping layer 810 includes depositing a titanium layer and depositing a titanium oxide layer. In one embodiment, the titanium layer is deposited prior to depositing the titanium oxide layer. In one embodiment, the titanium layer is deposited after depositing the titanium oxide layer. FIGS. 10A-10C provide additional details of embodiments.

In step 908, a top electrode 232 is formed. In one embodiment, forming a top electrode 232 includes depositing material for top electrodes and later etching this material (along with other materials) to form memory cells 200.

FIG. 10A is a flowchart of one embodiment of a process 1000 of fabricating reversible resistivity-switching elements 202 having a bi-layer capping layer 810. Process 1000 provides more details for the process of FIG. 9. Note that FIG. 9 describes a general flow for fabricating one reversible resistivity-switching element 202. FIG. 10A describes more details and might be used to fabricate many reversible resistivity-switching elements 202. In step 1002, a first layer for bottom electrodes 234 of memory cells 200 is deposited. As one example, silicon is deposited. In one embodiment, the silicon is heavily doped for good conductivity. The silicon may be doped as deposited, and/or doped after deposition.

In step 1004, a second layer for a metal oxide regions 230 is deposited above the material for the bottom electrodes 234. As one example, $HfO_x$ is deposited. In step 1006, material for bi-layer capping layers 110 is deposited above the material for the metal oxide regions 230. As one example, separate layers of Ti and $TiO_x$ are deposited. FIGS. 10B and 10C depict different embodiments for performing step 1006.

In step 1008, a third layer for top electrodes 232 is deposited above the material for the capping layers 810. As one example, a layer of TiN is deposited. In step 1010, a mask pattern is formed over the third layer for the top electrodes 232. In step 1012, patterning and etching is performed to form structures for individual reversible resistivity-switching element 202. The patterning and etching may also etch to form diode steering elements 204. As noted, the steering element 204 could be above or below the reversible resistivity-switching element 202. In some embodiments, the etching is also used to form the bottom conductors 206.

Note that, together, steps 1002, 1010, and 1012 are one embodiment of step 902. Likewise, together, steps 1004, 1010, and 1012 are one embodiment of step 904. Likewise together, steps 1006, 1010, and 1012 are one embodiment of step 906. Likewise together, steps 1008, 1010, and 1012 are one embodiment of step 908.

FIG. 10B depicts one embodiment of a process of depositing a bi-layer capping layer 810. Process 1020 is one embodiment of step 1006 of process 1000. Process 1020 begins after depositing the second layer for the metal oxide regions (step 1004, FIG. 10A). In step 1022, a titanium layer is deposited over the second layer for the metal oxide regions. In one embodiment, the titanium layer is deposited using plasma vapor deposition (PVD). However, other deposition techniques could be used. In one embodiment, a thermal anneal is performed prior to step 1022. This thermal anneal may crystallize the metal oxide region 230. A thermal anneal to crystallize the metal oxide region 230 may be performed at a different stage of device fabrication.

In step 1024, a titanium oxide layer is deposited over the titanium layer. In some embodiments, step 1024 includes depositing the titanium oxide layer over the titanium layer without air break. For example, the titanium layer could be deposited in a one chamber of a cluster tool and the titanium oxide layer may be deposited in another chamber of the cluster tool using. Between deposition steps the wafer could be transferred through a vacuum transfer chamber. As another example, both steps 1022 and 1024 may be performed in the same chamber with appropriate adjustments to the gas flow into the chamber (and without allowable the titanium deposited in step 1022 to be exposed to air prior to depositing the $TiO_x$).

In one embodiment, the titanium oxide layer is deposited using atomic layer deposition (ALD) during step 1024. Note that the titanium oxide layer may be deposited with the same or a different technique than the titanium layer. For example, PVD could be used for the titanium layer and ALD for the titanium oxide layer. However, using the same deposition technique for each layer is one possibility.

FIG. 10C depicts one embodiment of a process 1040 of depositing a bi-layer capping layer 810. Process 1040 is one embodiment of step 1006 of process 1000. Process 1040 begins after depositing the second layer for the metal oxide regions 230 (e.g., step 1004, FIG. 10A). In step 1042, a titanium oxide layer is deposited over the second layer for the metal oxide regions 230. In one embodiment, the titanium oxide layer is deposited using atomic layer deposition (ALD). In one embodiment, a thermal anneal is performed after step 1042. This thermal anneal may crystallize the metal oxide region 230. A thermal anneal to crystallize the metal oxide region 230 may be performed at a different stage of device fabrication.

In step 1044, a titanium layer is deposited over the titanium oxide layer that was deposited in step 1042. In one embodiment, the titanium layer is deposited using plasma vapor deposition (PVD). However, other deposition techniques could be used. In some embodiments, step 1044 includes depositing the titanium layer over the titanium oxide layer without air break. For example, the titanium oxide layer could be deposited in a one chamber of a cluster tool and the titanium layer be deposited in another chamber of the cluster tool. Between deposition steps the wafer could be transferred through a vacuum transfer chamber.

Note that when forming the titanium layer over the titanium oxide layer, that the next step may be to deposit the material for the top electrode 232 (e.g., heavily doped Si). To prevent oxidation of the titanium deposited in step 1044, the material for the top electrode may be deposited in situ, without air break. Alternatively, the titanium layer may be deposited in one chamber and the heavily doped Si may be deposited in another chamber, with the wafer being transferred through a vacuum transfer chamber between deposition steps.

Titanium Incorporation into Metal Oxide

In the process flows of the embodiments of FIGS. 9 and 10A-10C, titanium was added above the metal oxide region 230. In one embodiment, titanium is incorporated into the metal oxide 230. As one example, titanium is implanted into the metal oxide 230 after the metal oxide is deposited. As one example, titanium is implanted into the metal oxide 230 while the metal oxide is deposited. In one embodiment, a sub-plantation technique is used to add titanium into the metal oxide 230. This sub-plantation technique may result in distinct layers of metal oxide 230 around a layer of titanium. The titanium that is incorporated into the metal oxide 230 (or as a distinct layer surrounded by metal oxide) may act as a gettering agent. A capping layer of titanium or the like is not required (but is an option) if titanium is incorporated into the metal oxide 230.

Figures 11A, 11B:
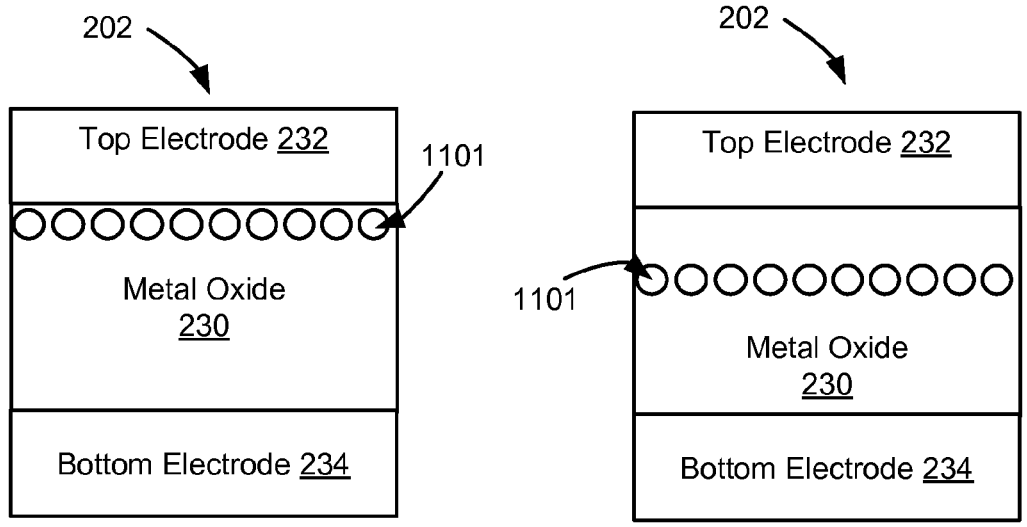
FIGS. 11A, 11B, and 11C depict embodiments of a reversible resistivity-switching element having titanium implanted into the metal oxide.
Figure 11C:
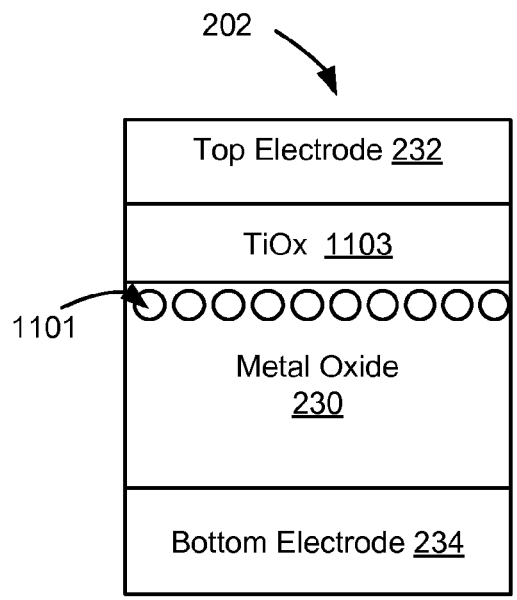

FIGS. 11A-11C depict embodiments of reversible resistivity-switching elements 202 having titanium implanted into the metal oxide 230. In these examples, the titanium may have been implanted after the metal oxide 230 was formed or while depositing the metal oxide 230. In the embodiment of FIG. 11A, the titanium 1101 is near the surface of the metal oxide 230. For example, the titanium was implanted in the metal oxide 230 near the interface with the top electrode 232. The reversible resistivity-switching element 202 of FIG. 11A includes a bottom electrode 234, metal oxide region 230, and top electrode 232.

FIG. 11B depicts one embodiment in which the titanium 1101 is implanted into the metal oxide 230 at a greater depth than the embodiment of FIG. 11A. The titanium 1101 may be implanted into the metal oxide 230 at any desired depth. Also note that the titanium 1101 may be implanted over any desired range of depths in the metal oxide 230.

FIG. 11C depicts another embodiment in which there is a TiOx layer 1103 between the metal oxide 230 and the top electrode 232. As noted above, the TiOx layer 1103 is one option when incorporating titanium 1101 into the metal oxide 230. The titanium 1101 has been implanted in the metal oxide 230 in a similar manner as the embodiment of FIG. 11A.

The reversible resistivity-switching elements 202 of FIG. 11A-11C may be used in any of the example devices depicted in FIG. 1, 2A, 2B, or 2C; however, the reversible resistivity-switching element 202 is not limited to those example devices.

Figure 11D:
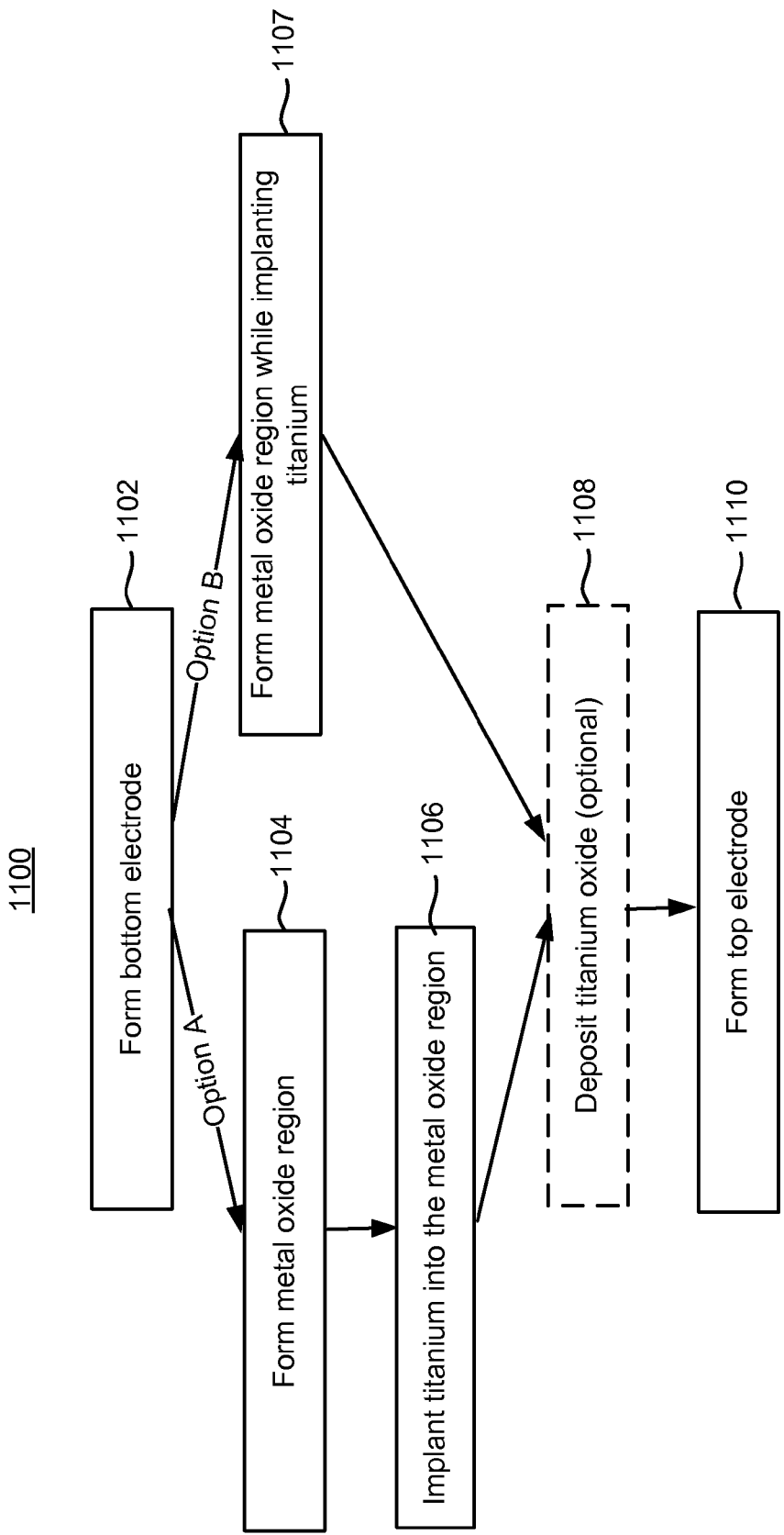
FIG. 11D is a flowchart illustrating one embodiment of a process of fabricating a reversible resistivity-switching element with titanium implanted into the metal oxide.

FIG. 11D is a flowchart illustrating one embodiment of a process 1100 of fabricating a reversible resistivity-switching element 202 with titanium implanted into the metal oxide 230. Implanting titanium is one technique for incorporating titanium into metal oxide 230. Process 1100 may be used to fabricate a reversible resistivity-switching element 202 such as those depicted in FIGS. 11A-11C. The process 1100 could be used as a part of fabricating a memory array such as the examples depicted in FIGS. 1 and 2A-2C. Thus, it will be understood that other process flow steps to form structures such as a steering diode 204, and conductors 206, 208 might be performed before and/or after the steps of process 1100.

In step 1102, a bottom electrode 234 of the reversible resistivity-switching element 202 is formed. In one embodiment, forming a bottom electrode 234 includes depositing material for bottom electrodes and later etching this material (along with other material) to form memory cells. After step 1102, options A and B are shown. In option A, titanium is implanted into the metal oxide after the metal oxide is deposited. In option B, titanium is implanted into the metal oxide while the metal oxide is deposited.

Steps 1104 and 1106 describe option A. In step 1104, a metal oxide region 230 is formed above the bottom electrode 234. Examples of metal oxides include, but are not limited to, $HfO_2$. In step 1106, titanium is implanted into the metal oxide region 230. The implantation energy may be selected to achieve a desired depth within the metal oxide region 230. In some embodiments, the titanium is implanted near the top surface of the metal oxide region 230. (e.g., near where the interface of the metal oxide 230 and top electrode 232 will be) However, the titanium may extend over any range of depths in the metal oxide 230. Note that the concentration of titanium may be relatively uniform or it may be doped to be deliberately non-uniform.

Step 1107 describes option B. In step 1107, titanium is implanted into the metal oxide during at least a portion of the deposition of the metal oxide. For example, throughout step 1107 a suitable combination of gasses may be introduced to cause metal oxide to be deposited. At suitable times during the deposition of the metal oxide, suitable gasses are introduced to cause titanium to be implanted into the metal oxide as it is being deposited.

Step 1108 may be performed after either option A or B is complete. In optional step 1108, a titanium oxide layer 1103 is formed above the metal oxide region 230. In step 1110, a top electrode 232 is formed. In one embodiment, forming a top electrode 232 includes depositing material for top electrodes and later etching this material (along with other material) to form memory cells.

Figure 12A:
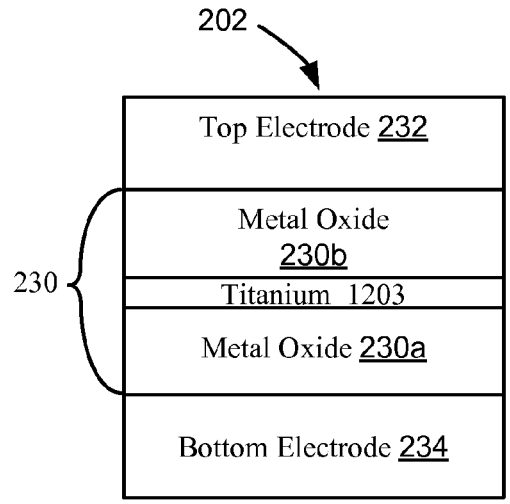
FIG. 12A depicts one embodiment of a reversible resistivity-switching element having titanium added into the metal oxide region.

As noted above, implantation of titanium into the metal oxide is deposited is used in some embodiments. However, this is not the only incorporate titanium to the metal oxide region 230. In one embodiment, sub-plantation is used to incorporate titanium into the metal oxide region 230. FIG. 12A depicts one embodiment of a reversible resistivity-switching element 202 having titanium incorporated into the metal oxide region 230. The reversible resistivity-switching element 202 includes a titanium region 1203 between a first metal oxide region 230a and a second metal oxide region 230b. The element 202 also has a bottom electrode 234 and a top electrode 232. As one example, the first metal oxide region 230a may be about 3-5 nm thick, the titanium region 1203 may be about 1-2 nm thick, and the second metal oxide region 230b may be about 5-8 nm thick.

Figure 12B:
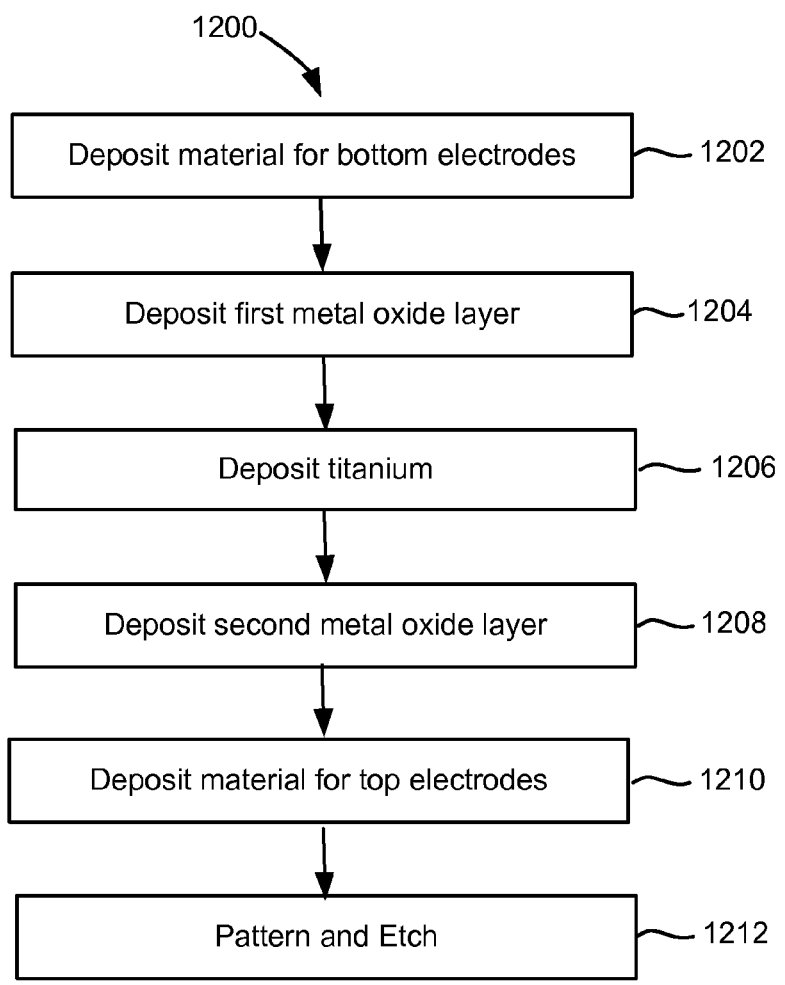
FIG. 12B is a flowchart of one embodiment of a process of fabricating a reversible resistivity-switching element using sub-plantation to add titanium into the metal oxide region.

FIG. 12B is a flowchart of one embodiment of a process 1200 of fabricating a reversible resistivity-switching element 202 using sub-plantation. Process 1200 may be used to fabricate a device such as the embodiment depicted in FIG. 12A. In step 1202, a first layer for bottom electrodes 234 of memory cells 200 is deposited. As one example, silicon is deposited. The silicon may be doped as deposited, and/or doped after deposition.

In step 1204, a first metal oxide layer is deposited above the material for the bottom electrode 234. As one example, $HfO_x$ is deposited. In one embodiment, ALD is used to deposit the metal oxide 230. An example range of thickness for the first metal oxide is 3-5 nm. However, the first metal oxide layer may be thicker or thinner.

In step 1206, titanium is deposited above the first metal oxide layer. In one embodiment, ALD is used to deposit the titanium. An example range of thicknesses is 1-2 nm. However, the titanium may be thicker or thinner. The deposition of the titanium may be in situ, without air break.

In step 1208, a second metal oxide layer is deposited above the titanium. As one example, $HfO_x$ is deposited. In one embodiment, ALD is used to deposit the metal oxide. An example range of thicknesses is 5-8 nm. However, the second metal layer may be thicker or thinner. The deposition of the titanium may be in situ, without air break.

In step 1210, a material for top electrodes 234 of memory cells 200 is deposited. As one example, TiN is deposited.

In step 1212, patterning and etching is performed to form structures for individual reversible resistivity-switching elements 202. The patterning and etching may also etch to form diode steering elements 204. As noted, the steering element 204 could be above or below the reversible resistivity-switching element 202. In some embodiments, the etching is also used to form the bottom conductors 206. One embodiment includes a method for fabricating a resistive random access memory element. The method comprises forming a bottom electrode, forming a metal oxide region above the bottom electrode, and forming a top electrode including. Forming the top electrode may include depositing an electrically conductive region above the metal oxide region, and depositing an oxygen diffusion resistant region above the electrically conductive region.

One embodiment includes a resistive random access memory (RRAM) element comprising a bottom electrode, a metal oxide region above the bottom electrode, and a top electrode that includes an electrically conductive region above the metal oxide region and an oxygen diffusion resistant region above the second electrically conductive region.

One embodiment includes a method for fabricating a resistive random access memory (RRAM) element. The method comprises forming a resistive random access memory (RRAM) element having a bottom electrode that includes a first electrically conductive material, a metal oxide region adjacent to the first electrically conductive region, and a top electrode that includes a second electrically conductive material adjacent to the metal oxide region. Forming the resistive random access memory (RRAM) element includes adding a trap passivation material to one or more of the first electrically conductive material, the metal oxide region, or the second electrically conductive material. The passivation material passivates traps at least one of a first interface between the metal oxide region and the bottom electrode or a second interface between the metal oxide region and the top electrode.

One embodiment includes a resistive random access memory (RRAM) element comprising a bottom electrode that includes a first electrically conductive material, a metal oxide region adjacent to the first electrically conductive region, and a top electrode adjacent to the metal oxide region and that includes a second electrically conductive material. One or more of the first electrically conductive material, the metal oxide region, or the second electrically conductive material includes a passivation material that passivates traps at least one of a first interface between the metal oxide region and the bottom electrode or a second interface between the metal oxide region and the top electrode.

One embodiment includes a method of fabricating a memory cell comprising forming a bottom electrode, forming a metal oxide memory region over the bottom electrode, forming a bi-layer capping region over the metal oxide region, and forming a top electrode over the bi-layer capping layer. Forming the bi-layer capping region may include depositing a titanium layer and depositing a titanium oxide layer.

One embodiment includes a method of fabricating non-volatile storage elements. The method comprises depositing a first layer for bottom electrodes, depositing a second layer over the first layer for metal oxide memory regions, and depositing a bi-layer over the second layer. Depositing the bi-layer includes depositing a titanium layer and depositing a titanium oxide layer. The method also includes depositing a third layer over the bi-layer for top electrodes; forming a mask pattern over the third layer; and etching the first layer, the second layer, the bi-layer, and the third layer based on the mask pattern.

One embodiment includes a method of fabricating a memory cell, the method comprising forming a bottom electrode, forming a metal oxide region, incorporating titanium into the metal oxide region, and forming a top electrode over the metal oxide region.

One embodiment includes a non-volatile storage element comprising a bottom electrode, a metal oxide memory region, a bi-layer capping region over the metal oxide region, and a top electrode over the bi-layer capping layer. The bi-layer capping region includes a titanium layer over the metal oxide memory region and a titanium oxide layer over the titanium layer.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain the principles of embodiments and practical applications, to thereby enable others skilled in the art to best utilize the various embodiments and with various modifications as are suited to the particular use contemplated. It is intended that the scope of the disclosure be defined by the claims appended hereto.

What is claimed is:

1. A method for fabricating a resistive random access memory element, the method comprising:
    forming a bottom electrode;
    forming a metal oxide region above the bottom electrode; and
    forming a top electrode including:
        depositing an electrically conductive region above the metal oxide region, the electrically conductive region having an exposed surface; and
        depositing an electrically conductive oxygen diffusion resistant region on the exposed surface of the electrically conductive region to prevent formation of an oxide layer on the surface of the electrically conductive region, wherein the forming a bottom electrode and the forming a top electrode includes implanting a trap passivation material into one or more of the bottom electrode or the top electrode.

2. A method as recited in claim 1, wherein the depositing an oxygen diffusion resistant region above the electrically conductive region includes depositing an oxygen diffusion resistant region in contact with the electrically conductive region.

3. A method as recited in claim 1, wherein the depositing an oxygen diffusion resistant region includes depositing heavily doped silicon, tungsten, or tungsten nitride.

4. A method as recited in claim 1, wherein the depositing an oxygen diffusion resistant region includes depositing the oxygen diffusion resistant region in situ without air break.

5. A method as recited in claim 1, wherein forming the metal oxide region includes depositing a region of hafnium oxide.

6. A method as recited in claim 1, wherein depositing the electrically conductive region includes depositing doped silicon.

7. A method as recited in claim 1, wherein depositing the electrically conductive region includes depositing a metal.

8. A method as recited in claim 1, wherein the forming a bottom electrode includes depositing doped silicon.

9. A method as recited in claim 1, further comprising forming a capping layer between the metal oxide region and the electrically conductive region.

10. The method of claim 1, wherein the oxygen diffusion resistant region includes heavily doped silicon.

11. The method of claim 1, wherein the oxygen diffusion resistant region includes tungsten nitride.

* * * * *